United States Patent [19]

Topliff

[11] Patent Number: 5,655,403

[45] Date of Patent: Aug. 12, 1997

[54] REVERSIBLE FLOAT FOR USE IN A TANK GAUGING SYSTEM

[75] Inventor: Edward R. Topliff, Huntington Beach, Calif.

[73] Assignee: Whessoe Varec, Inc., Cypress, Calif.

[21] Appl. No.: 442,880

[22] Filed: May 17, 1995

Related U.S. Application Data

[62] Division of Ser. No. 906,295, Jul. 1, 1992, abandoned.

[51] Int. Cl.$^6$ .............................. G01F 23/56; G01F 23/76; G01F 23/30

[52] U.S. Cl. .............................. 73/322.5; 73/319; 73/321; 33/759

[58] Field of Search .............................. 73/305, 306, 318, 73/319, 321, 322.5; 43/43.1, 43.14, 44.87; 33/758, 759, 719, 720, 721

[56] References Cited

U.S. PATENT DOCUMENTS

| | | | |
|---|---|---|---|
| 634,572 | 10/1899 | Clarke | 73/322.5 |
| 1,257,693 | 2/1918 | Furman | 73/321 |
| 2,251,721 | 8/1941 | Shepherd | 43/43.1 |
| 2,874,508 | 2/1959 | Anderson, Jr. | D22/146 |
| 2,904,998 | 9/1959 | Jurs et al. | 73/321 |
| 4,122,719 | 10/1978 | Carlson . | |
| 4,301,610 | 11/1981 | Brown | 43/43.1 |
| 4,459,584 | 7/1984 | Clarkson | 73/321 |
| 5,039,925 | 8/1991 | Schap . | |

FOREIGN PATENT DOCUMENTS

| | | | |
|---|---|---|---|
| 87180 | 4/1956 | Norway | 43/43.1 |
| 1539-828 | 2/1979 | United Kingdom | 73/322.5 |

OTHER PUBLICATIONS

Model 4100, PDS–4100 Jun. 1991, Varec Rosemount Brochure.

Model 4110, PDS–4110 Jul. 1991, Varec Rosemount Brochure.

1900 Series M4W, PDS 1900 Apr. 1992, Whessoe Varec Brochure.

Model 8200 Series, PDS 8200 Mar. 1992, Whessoe Varec Brochure.

Model 2500 Series, PDS 2500 Mar. 1992, Whessoe Varec Brochure.

Installation and Operations Manual For The Model 1900 Micro 4–Wire Transmitter, Document No. 33–08461, (Preliminary), Copyright 1991, Whessoe Varec.

Varec 8200 Series, Current Output Transmitter, Instruction Manual, Document No. 33–07383, Revision D, Nov. 1989.

George J. Blickley, Control Engineering, Tank Gaging Transmitter Performs More Functions, Aug. 1991, pp. 44–45.

Hart Smart Communications Protocol, The Rosemount Smart Family Product Data Sheet 2695, 1900, Rosemount Inc.eliminary), Copyright 1991, Whessoe Varec.

*Primary Examiner*—William A. Cuchlinski, Jr.
*Assistant Examiner*—Andrew Hirshfeld
*Attorney, Agent, or Firm*—Cushman Darby & Cushman Intellectual Property Group of Pillsbury Madison & Sutro LLP

[57] ABSTRACT

A reversible float assembly includes a float, an elongated flexible member, a first attachment disposed on a first surface of the float body, and a second attachment disposed on a second surface of the float body. The lower end of the elongated flexible member is connected to one of the first and second attachments. At least one guide eye connected with the float body is constructed and arranged to receive an elongated guide member to restrict movement of the body to generally vertical movement. The guide eye is disposed on the body at a position between the first attachment and the second attachment so that when the body floats on a liquid in the first orientation the guide eye is submerged in the liquid, and when the body floats on a liquid in a second orientation, the guide eye is disposed above the liquid.

1 Claim, 32 Drawing Sheets

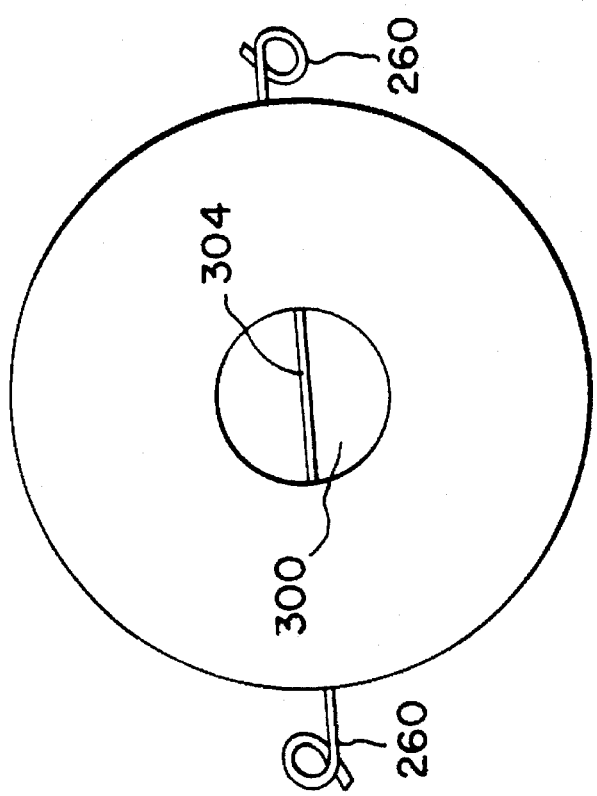
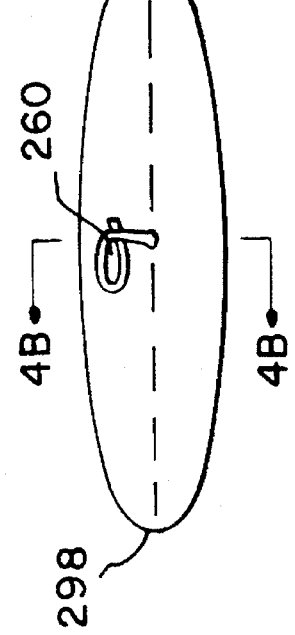
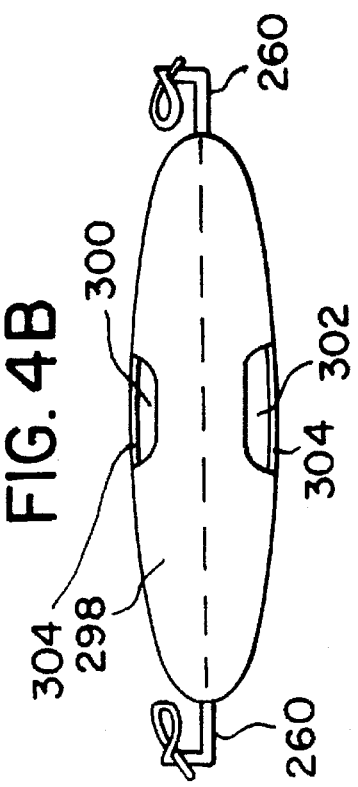

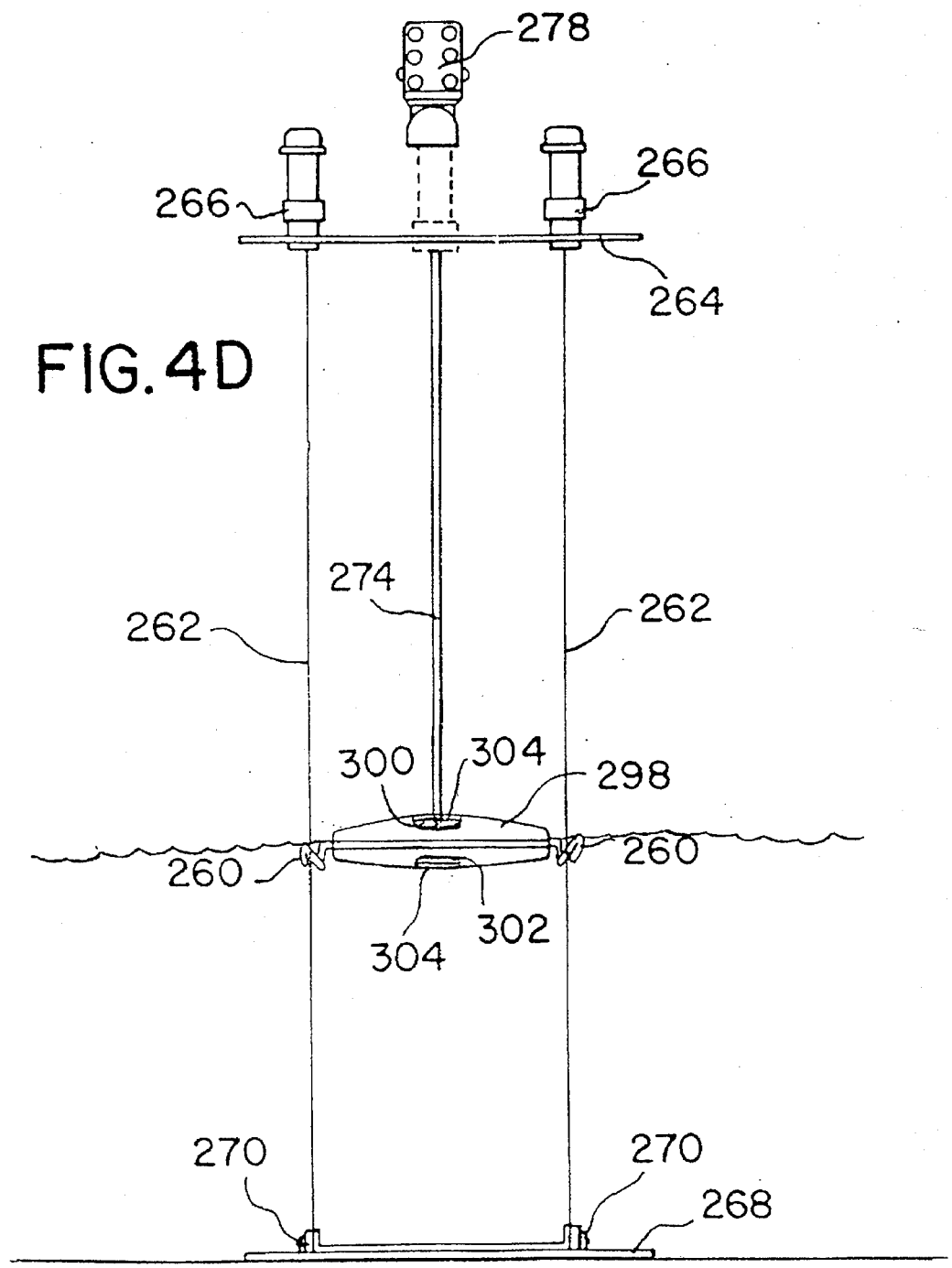

FIG. 9 PRIOR ART
**POLL TIMING
MARK OR SPACE**
**RESPONSE TIMING
ACCEPTABLE RANGE
MARK OR SPACE**
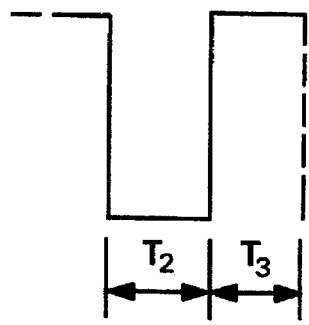
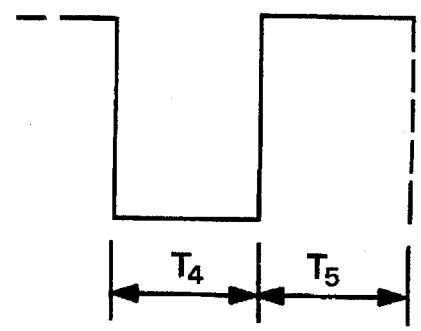
$T_2 = T_3 =$ :
HIGH SPEED = 2mS 10%
LOW SPEED = 8mS 10%
$T_4 = T_5 =$ :
HIGH SPEED = 0.5mS TO mS
LOW SPEED = 3 TO 25mS
T2 AND T4 = MARK OR SPACE PULSE
T3 AND T5 = TIME BETWEEN PULSES

ST START BIT (MARK)
RA RAISE
RS RESET

ST START BIT (MARK)
ID TRANSMITTER ID
AL 1 EXTERNAL ALARM BIT 1
AL 0 EXTERNAL ALARM BIT 0
PAR PARITY BIT

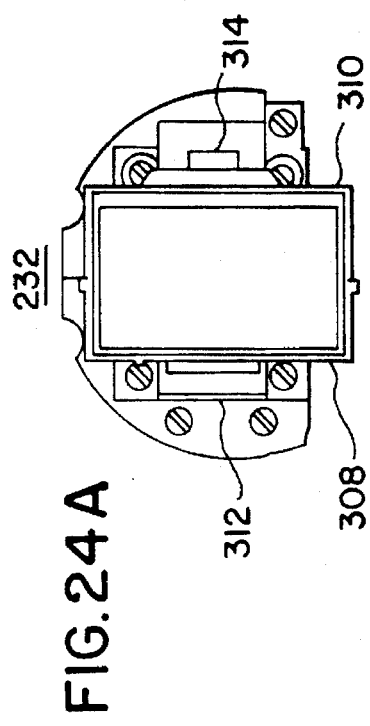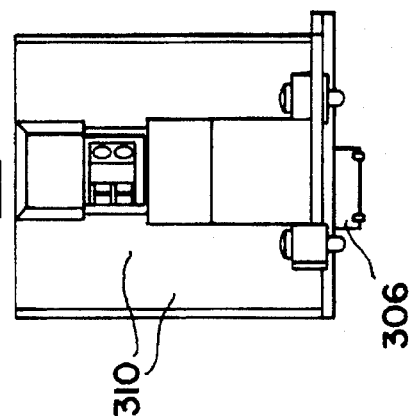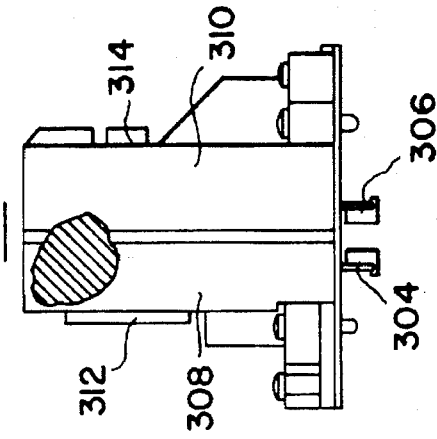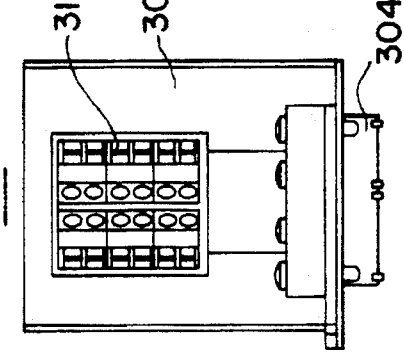

FIG. 28A

| ITEM | DESCRIPTION | REF. DES. | VENDOR PART NUMBER | VENDOR | U/M | QTY |
|---|---|---|---|---|---|---|
| 1 | .01MFD 100V | C1 | CK05BX103K | (GENERIC) | EA | 1 |
| 2 | 22PFD 200V | C2 | CK05BX221K | (GENERIC) | EA | 1 |
| 3 | .1MFD 100V | C3 | CK05BX104K | (GENERIC) | EA | 1 |
| 4 | DIODE-ZENER, 10V, 5W | D1-D4 | 1N5347B | (GENERIC) | EA | 4 |
| 5 | 5.6 OHM, 1-1/2W, 5% W.W. | R1 | UB-2 (VALUE) | RIEDON | EA | 1 |
| 6 | 175 OHM, 5W, 1% W.W. | R2 | UB-5C (VALUE) | RIEDON | EA | 1 |
| 7 | 470K, 1/4 W, 5% FILM | R3 | RCR07GF474J | (GENERIC) | EA | 1 |
| 8 | 4.7MEG, 1/4W, 5% | R4 | RCR07G475J | (GENERIC) | EA | 1 |
| 9 | 10K, 1/4W, 5% | R5 | RCR07G103J | (GENERIC) | EA | 1 |
| 10 | XSTR,J-CHANNEL FET | Q1 | 2N5484 | (GENERIC) | EA | 1 |
| 11 | TERMINAL BLOCK, 2-POS | TB1 | SMKDS1.5-2-5.08 | PHOENIX | EA | 1 |
| 12 | CONNECTOR, 3-POS, .1 SP | C5 | 22-16-2031 | MOLEX | EA | 1 |
| 13 | FUSE ,1/16A, 250V,PC-MT | F1 | 202.062 | LITTELFUSE | EA | 1 |
| 14 | TERMINAL, SWAGE-IN TURRET | E1,E2 | 1280B | USECO | EA | 2 |
| 15 | LIGHTNING SUPPRESSOR,GAS-TYPE | SP1 | 2027-15-B | JOSYLN | EA | 1 |
| 16 | HART TERMINAL BOARD | -- | 03-09149 | VAREC | EA | 1 |
| 17 | 100PF, 400V, 10% | C4 | FKS3-(VALUE) | WIMA | EA | 1 |
| 18 | BLOCK - FILLER | | 02-09733 | VAREC | EA | 1 |
| 19 | SPCR, 9/16" X 4-40 THD | | 8675 | HH SMITH | EA | 3 |
| 20 | ADHESIVE,EASTMAN 910 | | | | -- | A/R |
| 21 | PHMS, 4-40 X .50" SST | | | | EA | 2 |

FIG. 28B

| ITEM | DESCRIPTION | REF. DES. | VENDOR PART NUMBER | VENDOR | U/M | QTY |
|---|---|---|---|---|---|---|
| 1 | .022MFD 400V 10% PLYPRP. | C1 | MKP10- (VALUE) | WIMA | EA | 1 |
| 2 | 0.001MFD 200V DIP-CER | C2,C3,C4 | CK05BX102K | SPRAGUE | EA | 3 |
| 3 | 100 OHM. 1/4W, 5% | R1,R2 | RCR07G101J | (GENERIC) | EA | 2 |
| 4 | 10 OHM, 1-1/2W, 5W | R3-R6 | UB-2 (VALUE) | RIEDON | EA | 2 |
| 5 | 20 OHM, 1-1/2W. 5% W.W. | R4,R5,R7 R8 | UB-2 (VALUE) | RIEDON | EA | 4 |
| 6 | DIODE, ZENER, 6.2V, 5% | D1,D2,D6 D7,D8,D9 | 1N4735A | (GENERIC) | EA | 6 |
| 7 | DIODE,SURGE SUPRSR,1.5KW | D3,D4,D5 | 1N5654A | (GENERIC) | EA | 3 |
| 8 | VARISTOR METAL OXIDE, 39VDC | MOV1 | CK06BX104K | (GENERIC) | EA | 1 |
| 9 | LIGHTNING SUPPRESSOR,GAS-TYPE | SP1-SP4 | 2027-15-B | JOSYLN | EA | 4 |
| 10 | CONNECTOR, 5-POS, .1 SP | J10 | 22-16-2051 | MOLEX | EA | 1 |
| 11 | LUG-RING, UNINS. 14AWG. #6H. | GL1 | B14-6 | T&B | EA | 1 |
| 12 | WIRE 16AWG STR'D CSA GRN | -- | 16-26/30-1007 GRN | STORM PR. | IN. | 5 |
| 13 | CONNECTOR, 6-POS. 1 SP | J11 | 22-16-2061 | MOLEX | EA | 1 |
| 14 | TERM. BLOCK, 2-POS | TB1,TB2 | SMKDS1.5-2-5.08 | PHOENIX | EA | 6 |
| 15 | FIELD TERMINAL BOARD | -- | 03-09146 | VAREC | EA | 1 |
| 16 | .01MFD 100V 20% MONO-CER | C5-C11 | SR211E103MAA | AVX | EA | 7 |
| 17 | STD. RECOVERY RECT., 400V 3A | D10 | 1N5404 | MOTOROLA | EA | 1 |

306

306

306

306

REVERSIBLE FLOAT FOR USE IN A TANK GAUGING SYSTEM

This is a division of application Ser. No. 07/906,295, filed Jul. 1, 1992, now abandoned.

BACKGROUND OF THE INVENTION

1. Field of the Invention

The present invention relates to systems used for remote gaging of storage tanks used in storage and processing of petroleum and chemical products, paint, ink, foodstuffs, and the like, and to remote gaging networks using communications protocols for data telemetry.

2. Description of the Related Art

Data telemetry applications for remote sensing of storage tanks in refineries, tank farms, and the like are known in the art. A typical sensing system has a level gauge float or similar sensor connected to a gaugehead. The sensor drives the gaugehead, and the gaugehead provides a local visual indication of the level of liquid in the storage tank. A level encoder/transmitter unit may be mechanically coupled to the gaugehead to translate the mechanical movement of the float sensor/gaugehead assembly to a positionally-encoded electrical signal and to transmit the signal to a remote collection or control system. Other sensors may additionally be provided to measure tank parameters such as temperature, etc.

FIGS. 1A and 1B show a typical float-gaugehead installation in a storage tank as known in the prior art. In this system, float 258 has guide eyes 260 mounted on its edges. Guide wires 262 are fixed to the roof 264 of the tank with roof mounts 266 and to the bottom 268 of the tank with bottom mounts 270 and maintain float 258 on a substantially vertical axis so that it may move up and down in response to changing surface levels of fluid in the tank.

As can be seen from front view 1A and side view 1B, float 258 is generally discus-shaped. Float 258 may be made of any sufficiently buoyant material which is non-reactive with the tank contents. A hollow stainless steel float approximately 14.5 inches in diameter With a 17 inch distance between guide eye centers has been found to be advantageous in this application. For applications where caustic chemicals are handled, the float may be advantageously made of a relatively inert material such as MONEL or CARPENTER 20.

Eyelet 272 is mounted on the top of float 258 and connected to measuring tape 274 via coupler 276. Measuring tape 274 passes through tank roof 264, sheave elbows 278 and their associated piping, and into gaugehead 10 at primary tape opening 280. Advantageously, measuring tape 274 may be constructed from a stainless steel tape having precision perforations to engage pins on a sprocket in gaugehead 10.

The float need not be freely moveable over the entire height of the tank, but can be disposed in a float well. One type of float well commonly known in the art is shown in FIG. 2. FIG. 2 shows a fixed float well 284. Fixed float well 284 encloses float 258 and stabilizes it within a limited area, thereby obviating the need for guide wires. The fixed float well is mounted to tank wall 286 by float well mount 288 so that the range of travel of float 258 within fixed float well 284 accommodates the tank levels desired to be measured.

Another type of float well used in the art is shown in FIG. 3. FIG. 3 shows a floating float well 290 used in a floating roof tank. In this system, floating roof assembly 292 comprises float well 290, buoyancy chamber 294, and floating roof sealing element 294. Buoyancy chamber 294 causes floating roof assembly 292 to float on the surface of liquid in the tank as it rises and falls, and floating roof selling element 294 maintains a seal between the tank interior and the tank's external environment to prevent contamination of the liquid. Due to the relatively large mass of floating roof assembly 292, it is somewhat insensitive to changes in the liquid level; however, float 258, which is freely moveable within float well 290, is able to react to small changes in the liquid level, thereby permitting a precise measurement of the level.

Of course, the float system may be used in a wide range of tank shapes. Further, gaugehead 10 may be mounted atop the tank and measuring tape 274 fed into it via auxiliary tape opening 282, thus obviating the need for sheave elbows 278 and their associated piping.

In some applications, it is desirable to maintain float guide eyes 260 above the surface of the tank liquid. In other applications, it is necessary to keep float guide eyes 260 below the liquid surface. Consequently, two versions of float 258 are required. One version, shown in FIGS. 1≡3 has guide eyes 260 offset in a direction opposite that of eyelet 272 so guide eyes 260 will be submerged when float 258 is on the liquid surface. The other version has guide eyes 260 offset in the same direction as eyelet 272 so they will always be above the liquid level. The need for two different types of float for this application has resulted in unnecessary complexity of the gaging system.

FIG. 5 shows a Varec Model 2500 Automatic Tank Gauge, which is a typical gaugehead and encoder/transmitter system according to the prior art. Gaugehead 10 includes sprocket wheel 14 which engages holes in measuring tape 274 fed into gaugehead 10. through primary tape opening 280 as shown in FIG. 6, or alternatively, through secondary tape opening 282. Gaugehead 10 has a level meter face 16 fixed on one side. The sprocket/meter face assembly is driven to provide a tank level indication by way of viewing window 20. The calibration of the gaugehead meter may be checked with calibration knob 22.

The gaugehead may be used in a stand-alone configuration to provide level readings visible at the tank site. Level encoder/transmitter 24 may be mounted on gaugehead 10 to provide a data telemetry capability. FIG. 6 shows a typical method of coupling level encoder/transmitter 24 to gaugehead 10. In this arrangement, encoder/transmitter body 26 is mounted on gaugehead body 18 reverse to viewing window 20. Slotted drive coupling 28 links shaft 30 of level encoder/transmitter 24 to a drive pin 32 eccentrically located on sprocket wheel 16 of gaugehead 10. In this manner, when sprocket wheel 16 is driven by level sensor input 12, rotational motion is imparted to encoder/transmitter shaft 30. This rotational movement of shaft 30 is then converted into an information-bearing electrical signal as will be more fully described below, and the resultant signal is presented at transmitter output 34 connected to data cable 36.

The level encoder/transmitter may provide an analog or digital output signal. FIG. 7 is an exploded view of an analog level encoder/transmitter such as the Varec Model 8200 Current Output Transmitter or a similar unit. In this device, encoder/transmitter shaft 30 is coupled to encoder shaft 38 mounted on encoder assembly 40 by a worm gear arrangement. A potentiometer is coupled to encoder shaft 38 so that rotational motion imparted to encoder/transmitter shaft 30 is transmitted to the potentiometer, thus varying the resistance of the potentiometer.

Calibration disk 42 is also coupled to encoder shaft 38. Calibration disk 42 has a scale inscribed around its periphery which is used to place the shaft/potentiometer assembly in arbitrary positions for calibration purposes. Limit switches may be provided on limit switch mounting plate 44 to provide indications when calibration disk 42 (and thus the tank liquid level) are at extreme high and low positions.

The potentiometer output is provided to transmitter board 46 by way of connector cable 48. Transmitter board 46 converts the voltage-varying signal produced by the potentiometer to a current-varying signal using, for example, a linear integrated circuit. The signal is then transmitted to a remote device byway of transmitter output. 34 and data cable 36, as shown in FIG. 5. The entire encoder/transmitter is enclosed by cover 50 mounted to encoder/transmitter body 26.

The signal produced by the transmitter may conform to any generally accepted standard. It has been found that output signals directly proportional to liquid level and varying from 4–20 mA or from 10–50 mA provide an acceptable level of compatibility with other devices. Also, the transmitter may be designed to provide an output signal increasing with an increase in tank level; alternatively, it may provide an output signal decreasing with an increase in tank level.

As noted above, the level encoder/transmitter may alternatively provide a digital output signal. FIG. 8 is an exploded view of a digital level encoder/transmitter such as the Varec Model 1900 Digital Transmitter or a similar unit. In this device, encoder/transmitter shaft 30 is coupled to encoder disk assembly 52 mounted on encoder mechanism 54 so that rotational motion imparted to encoder/transmitter shaft 30 is transmitted to encoder disk assembly 52.

Encoder disk assembly 52 may be a brush-type encoder disk. In this arrangement, two non-conductive disks mounted on encoder/transmitter shaft 30 each has one or more metallic traces laminated on it. When the disks are rotated by encoder/transmitter shaft 30, the traces pass under brushes touching the disk surfaces, thus alternately forming and breaking electrical connections. The make-break actions thus provide positional information on the tank level.

Alternately, encoder disk assembly 52 may be an optical-type encoder disk. In this arrangement, two black metal disks each having a code pattern cut therethrough are mounted on encoder/transmitter shaft 30 and are disposed between an array of light emitting diodes (LEDs) on one side of the disks and an array of photodetectors such as phototransistors on the other side of the disks. When the disks are rotated by the encoder/transmitter shaft 30, the alternately form and break an optical path between the LEDs and the photodetectors. This action provides positional information on the tank level. The coding pattern on either type of disk may be designed to provide level information in English units or metric units.

Calibration disk 42 is also coupled to transmitter/encoder shaft 38 through a gear arrangement. Calibration disk 42 has a scale inscribed around its periphery which is used to place the encoder disk in arbitrary positions for calibration purposes. Limit switches may be provided on limit switch mounting plate 56 to provide indications when encoder disk 52 (and thus the tank liquid level) are at extreme high and low positions.

The output of the encoder disk brushes or optical sensors is provided to CPU board 58 by way of CPU connector cable assembly 60 which mates with encoder input connector 62 on CPU board 58. CPU board 58 is powered by power supply board 64 and converts the signal produced by the brushes or sensors to a digital signal which is then presented at CPU output connector assembly 66 and transmitted to a remote device by way of transmitter output 34 and data cable 36. Condulet junction box 68 may be provided on encoder/transmitter housing 26 to provide a convenient means of terminating signal conductors, sensor inputs, and power cables. The entire encoder/transmitter is enclosed by cover 50 mounted to encoder/transmitter body 26.

The signal produced by the transmitter may conform to any generally accepted standard. One format that has been found to work particularly well in environments where tank gaging is commonly used is the Varec digital mark/space pulse code. The mark/space pulse code is implemented on a four-wire field interface. Two wires, B+ and B−, provide power to the encoder/transmitter, while the other two wires, Mark and Space, carry tank level information. Each of these lines is normally held at +48 VDC and dropped to 0 VDC to indicate a mark (on the Mark line) or a space (on the Space line). The interface is idle when both lines are high, and the interface is in a fault state when both lines are low.

Mark/space communications must conform to pulse timing constraints to ensure reliability and accuracy in data communications. FIG. 9 illustrates the timing considerations required in performing mark/space communications at two differing communications speeds as implemented in the Varec Model 1900 Digital Transmitter.

Using the four-wire field interface as described above, a messaging protocol may be implemented between the transmitted and a remote acquisition device. FIG. 10 shows the structure of the messaging protocol implemented in the Varec Model 1900 Digital Transmitter. To initiate a gaging operation, the remote acquisition device sends a poll message on the four-wire interface. The interrogation message is a 16-bit message as depicted in FIG. 11 and consisting of the following bits:

| Bit(s) | Interpretation |
| --- | --- |
| 1 | start bit (always Mark) |
| 2 | unused |
| 3, 4 | optional |
| 5–8 | most significant device ID bits (BCD ID×100) |
| 9–12 | next most significant device ID bits (BCD ID×10) |
| 13–16 | least most significant device ID bits (BCD ID×1) |

In response to the polling message, the device having an identification number matching the one in the polling message may transmit a 40-bit response message as depicted in FIG. 12 and consisting of the following bits:

| Bit(s) | Interpretation |
| --- | --- |
| 1 | start bit (always Mark) |
| 2, 3 | unused |
| 4–7 | most significant device ID bits (BCD ID×100) |
| 8–11 | next most significant device ID bits (BCD ID×10) |
| 12–15 | least most significant device ID bits (BCD ID×1) |
| 16 | reference bit (always Space) |
| 17–34 | level data |
| 37, 38 | optional |
| 40 | parity bit |

In the response message, the parity is set to odd Mark parity; that is, when the number of Mark pulses in bits 1–39 of the message is even, the parity bit is a Mark. When the number of Mark pulses in bits 1–39 of the message is odd, the parity bit is a Space. Thus, the parity bit ensures that the number of Mark pulses in every message is odd, and if the remote acquisition device receives a response message with an even number of Mark pulses, a fault condition has occurred.

For enhanced reliability, the level data in the response message is transmitted in a reflected Gray code format, in which there is only one bit change for a single digit change of measurement data. FIG. 13 shows a decimal English measurement system code sequence with a range of 00.00 to 79.99 feet in increments of 0.01 feet. Note that in the 0.01 foot increment code, there is only one element change as the level increases from 0.00 to 0.09. Over an 80-foot range, however, this code is required to repeat 8,000 times. Under these conditions, 0.09 and 0.00 become adjacent increments. The code for these increments must still satisfy the rule for only one code element change between adjacent increments. This would not be difficult if only the FTx0.01 column were involved. The FTx0.1, FTx1 and FTx10 columns, however, also come into play.

The above conflict is resolved by using the code itself to determine the code elements. In the FTx0.01 column in FIG. 13, when the level has reached 0.09, the code begins to repeat the preceding in a reflected format. This results in 0.09 being the same as 0.00. The reflected portion of the code is labelled as ODD ad refers to the next significant digit—in this case, the FTx0.1 column.

Zero is considered to be an even number as are 2, 4, 6 and 8. All other numbers are considered as odd. Note that the requirement that only one code element change between adjacent terminals is still satisfied. When the level reaches 0.19, the code is 0001 0000 and has reached a point where 0.09 (odd) is the same code as 0.00 (even). When the level reaches the next increment, only one code element changes (#11) from 0 to 1, and the code reads 011 0000. The 0.1 code is now even, and the 0.01 code now used is also even. The similarity applies to the relationship between FTx0.1 and FTx1.0. The even and odd groups for the FTx0.1 code refer to the odd and even conditions of FTx10 code, and the even and odd groups for the FTx1 code refer to the odd and even conditions of FTx10 code. This coding principle also applies when the level increments are i mm in the metric system, as shown in FIG. 14, or in a fractional coding system, as shown in FIG. 15.

The above-described prior art encoders are absolute level encoders; that is, they sense an absolute tank level corresponding to a given float sensor output. Incremental level encoders are also known in the art. These encoders sense a change in the tank level corresponding to a given change in the output of the float sensor. If a starting reference level is known, incremental sensing information may be used to determine the tank level position; however, it has been found that incremental encoders are more sensitive to errors resulting from transient voltages, excessive speed, stray light, power losses and the like.

Another tank gaging parameter often monitored is the temperature of the liquid in the tank. While accurate and precise measurement of the liquid temperature is often necessary for process control procedures, it is sometimes difficult to obtain reliable temperature measurements due to errors induced by internal component and ambient circuit factors.

Some traditional circuits based on resistive temperature devices (RTDs) use potentiometers to compensate for measurement errors present at room temperature. Such techniques involve critical and time-consuming calibration procedures which do not entirely compensate for the measurement errors.

Another compensation technique known in the art involves mathematical modeling with automated equipment to characterize the measurement errors and then nullifying the errors predicted by the model with software parameters. This method again requires expensive equipment and is similarly labor-intensive. Moreover, the temperature measurement device's firmware must be reprogrammed or replaced each time the circuit is repaired or replaced. Thus, the software compensation technique is unsuitable for low volume production applications.

The encoder/transmitter described above may communicate with a remote data acquisition device via any generally recognized standard. One protocol that has been developed for process control applications such as this and which is wellknown in the art is the RS-485/MODBUS protocol developed by Modicon. Another appropriate standard is the Varec Mark/Space protocol previously described. Using one of these protocols, data from the transmitter may be sent over long distances to a central acquisition station. With long wiring runs such as these, the gaging system is prone to lightning strikes and other induced transients; therefore, some type of lightning and surge protection is necessary for large distributed gaging systems.

SUMMARY OF THE INVENTION

It is an object of this invention to provide a tank gaging system having a high degree of reliability.

It is another object of this invention to provide a tank gaging system having reduced complexity and reduced maintenance requirements.

It is still another object of this invention to provide a tank gaging system having increased component and network configuration capabilities.

It is yet another object of this invention to provide a tank gaging sensor having level encoding with improved error detection characteristics.

It is another object of this invention to provide an incremental tank level encoder having absolute encoder reliability characteristics.

It is still another object of this invention to provide a gaging system for sensing tank characteristics having improved error compensation characteristics.

It is a further object of this invention to provide a tank gaging system having improved lightning resistance and Intrinsic Safety (I.S.) characteristics.

The above objects are achieved by providing a float for a tank gaging system having depressions on the top and bottom center portions of the float. A rod is welded across each of the depressions to provide an eylet region for attaching a measuring tape thereto. Offset guide eyes are welded to the float as in the prior art to provide a single float construction that may be used with the guide eyes submerged or above the liquid in the tank.

The above objects are further achieved by providing a level encoder having two slotted disks coupled to a gaugehead which alternately admit and interrupt light to optical sensors to provide relative, incremental positional change and direction information as well as an error detection capability. A microprocessor converts this information to absolute data and provides it to a transmitter unit. The transmitter may also be provide with data from other gaging sensor, such as an error-compensated temperature measurement of the tank contents. The transmitter may be connected to a remote data acquisition device through isolated inputs and outputs for protection against lightning strikes.

The above objects are further achieved by providing a system using two voltage reference sources, a multiplexer, analog-digital (A/D) converter and microprocessor to provide a self-calibrating, error compensated temperature measurement device.

BRIEF DESCRIPTION OF THE DRAWINGS

These and other objects and advantages of this invention will become apparent and more readily appreciated from the following description of the presently preferred exemplary embodiments, taken in conjunction with the accompanying drawings, of which:

FIGS. 4A–4C are a side view, front view, and top view, respectively, of a tank gaging system float according to the present invention.

FIG. 4D is a front view of the float assembly of the invention.

FIG. 9 is a diagram showing timing requirements in prior art gaging system communications.

FIGS. 24A–24D are a top view and side views, respectively, of an Intrinsically Safe (I.S.) lightning barrier/termination block according to the present invention.

FIGS. 28A–28B are parts lists for preferred embodiments of the circuits schematically shown in FIGS. 26 and 27, respectively.

DETAILED DESCRIPTION OF THE PRESENTLY PREFERRED EXEMPLARY EMBODIMENTS

Figure 16:
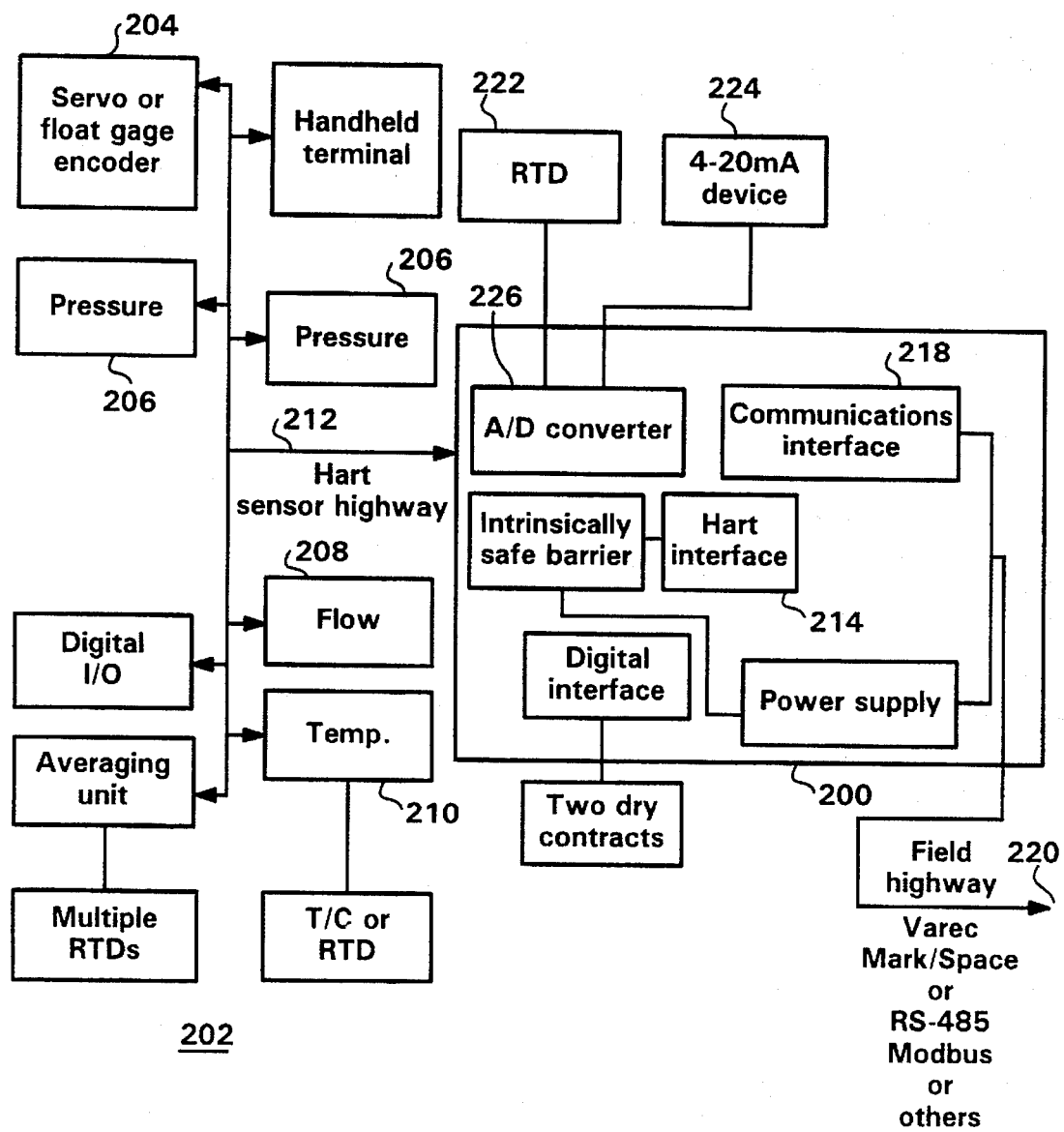
FIG. 16 is a block diagram showing a tank gaging system according to the present invention.

A tank gaging system according to the present invention will now be described with reference to FIG. 16. In this Figure, a multifunction transmitter 200 is connected to a variety of tank gaging sensors, collectively labelled 202. These sensors may include a level encoder 204, pressure sensors 206, a flow sensor 208, a temperature measurement device 210, or any other sensing device capable of communicating with transmitter 200 via any generally accepted standard, such as the Highway Addressable Remote Transducer (HART) protocol developed by Rosemont, which is known in the art.

As noted above, the sensors 202 may communicate with transmitter 200 via a HART bus 212. Transmitter 202 has a HART interface 214 which is connected to HART bus 212 through an integral combined lightning and surge protector/intrinsically safe (I.S.) barrier 216. Data transmitted over HART bus 212 to HART interface 214 is provided to communications interface 218, which may transmit the data to a remote data acquisition device via field highway 220. Data may be transmitted on field highway 220 using any generally accepted protocol, such as the Varec Mark/Space protocol or the RS-485 Modbus protocol, which are known in the art.

In addition to sensors 202 on HART bus 212, transmitter 200 may also receive data from RTD 222, as well as another tank sensor 224 which provides a 4-20 mA output signal. Analog data from these sensors are provided to communications interface 218 using a novel error compensation system which includes analog-digital converter 226.

A tank gaging float according to the present invention will now be described with particular reference to FIGS. 4A-4C. In these Figures, float 298 has an upper depression 300 in its top surface and a lower depression 302 in its bottom surface. Rods 304 are welded onto the peripheral edges of depressions 300 and 302 to provide eyelets to which a coupler or measuring tape may be attached as is known in the art. With this novel float structure, a measuring tape may be attached to the eyelet at upper depression 300 to provide a float having guide eyes 260 maintained above the surface of the liquid upon which the device floats. Alternatively, a measuring tape may be attached to the eyelet at lower depression 302 to provide a float having guide eyes submerged below the surface of the liquid upon which the device floats. By providing the guide eyes offset from the equatorial plane, the same float can be used in a reversible fashion such that in one orientation the guide eyes remain above the surface of the liquid and in an opposite orientation the guide eyes remain below the surface of the liquid to be measured. In this way, one float may be used for both types of applications, thus increasing the flexibility and reducing the complexity of the tank gaging system.

Figure 1B:
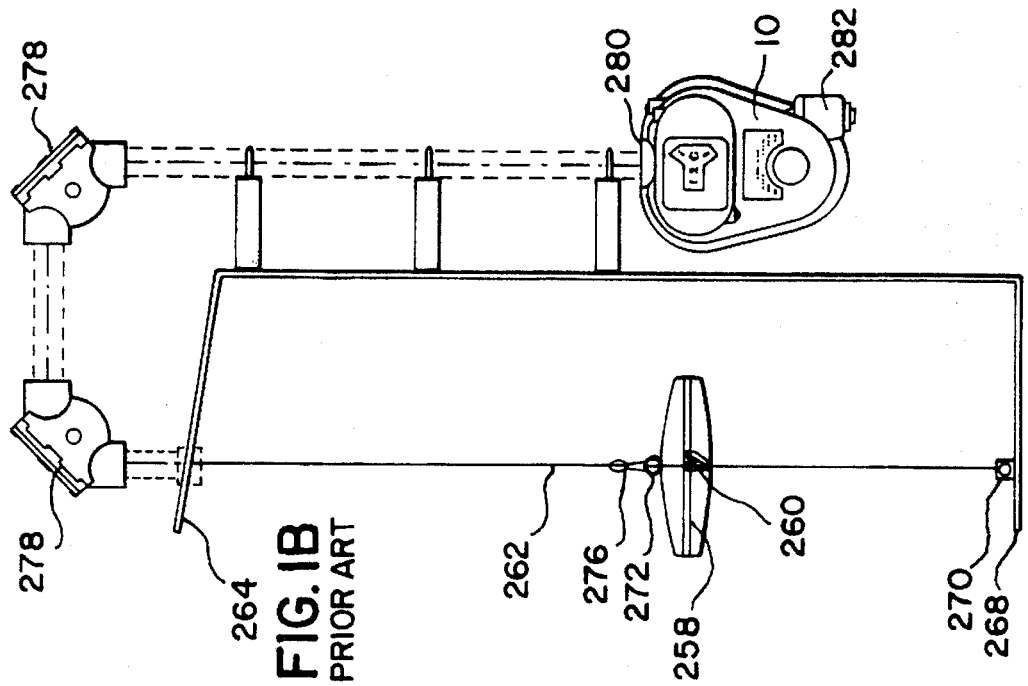
FIGS. 1A and 1B are front and side views, respectively, of a float for a tank gaging system according to the prior art.
Figure 1A:
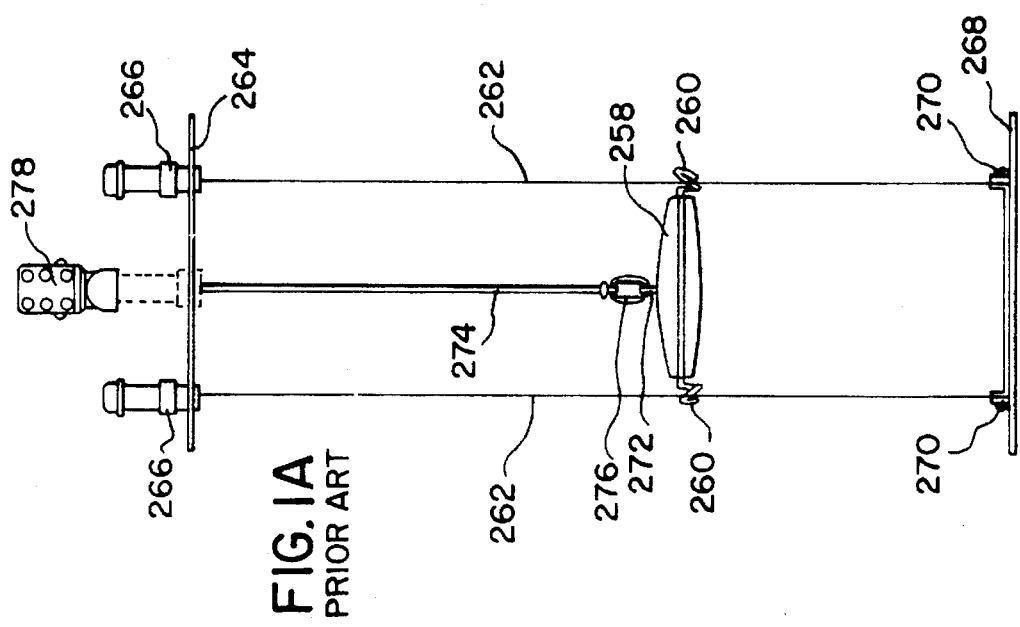
Figure 3:
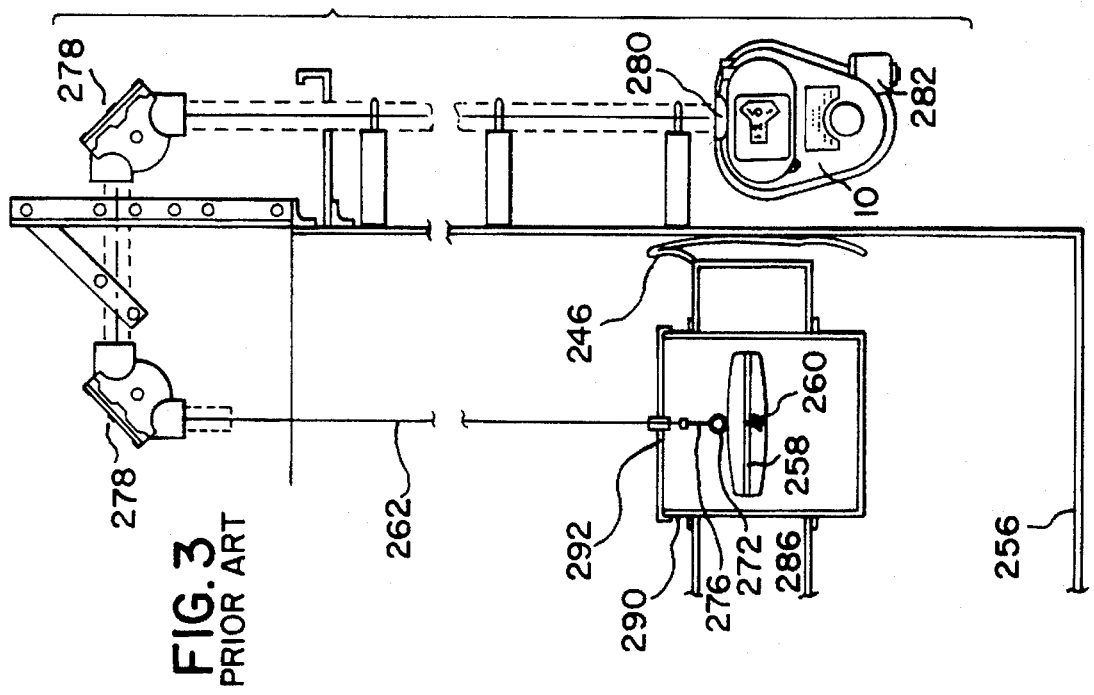
FIG. 3 shows a prior art float used in a floating roof float cage arrangement.
Figure 2:
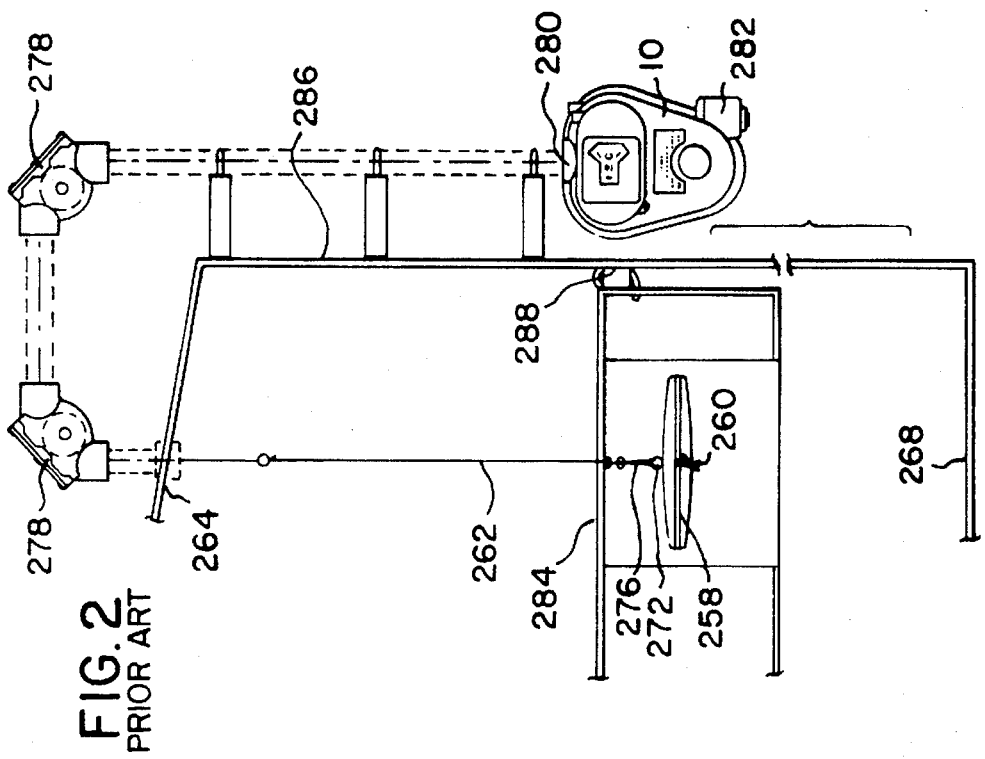
FIG. 2 depicts a prior art float used in a float cage arrangement.
Figure 5:
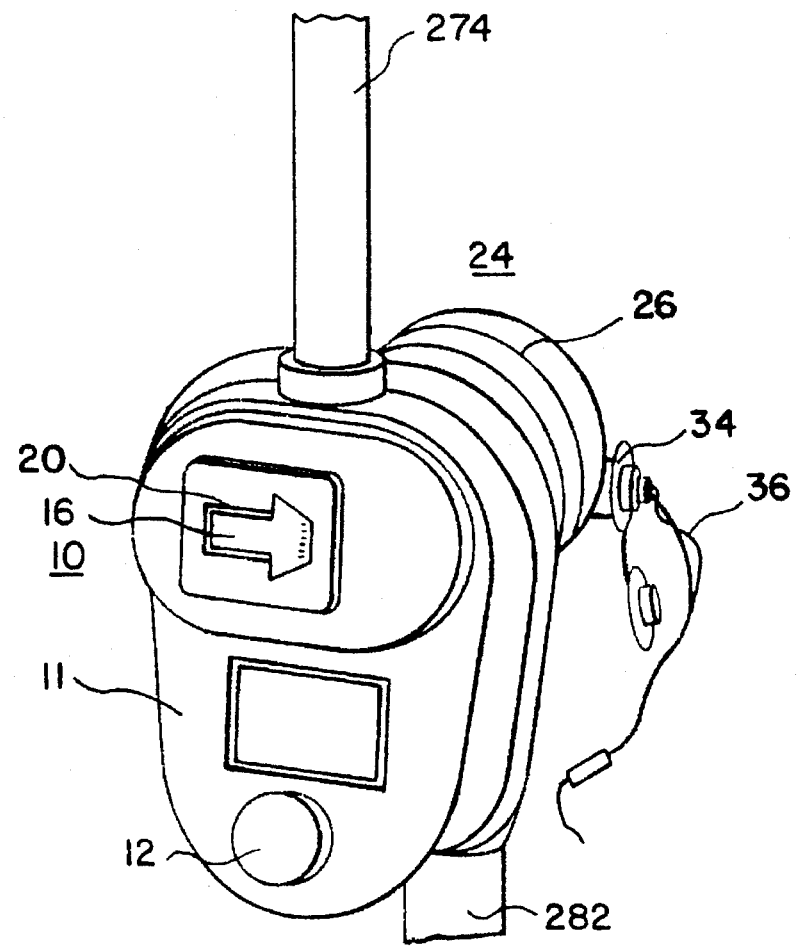
FIG. 5 is a gaugehead and encoder/transmitter assembly according to the prior art.
Figure 6:
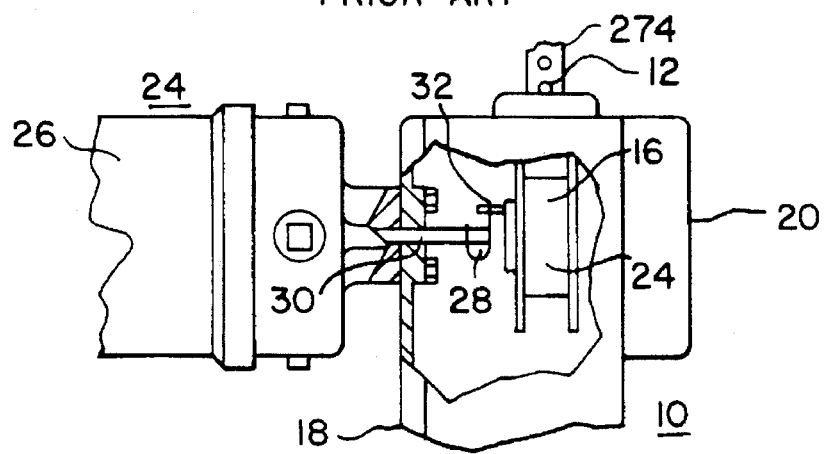
FIG. 6 is a cutaway side view of the assembly of FIG. 5 illustrating the coupling of the gaugehead to the encoder/transmitter.
Figure 7:
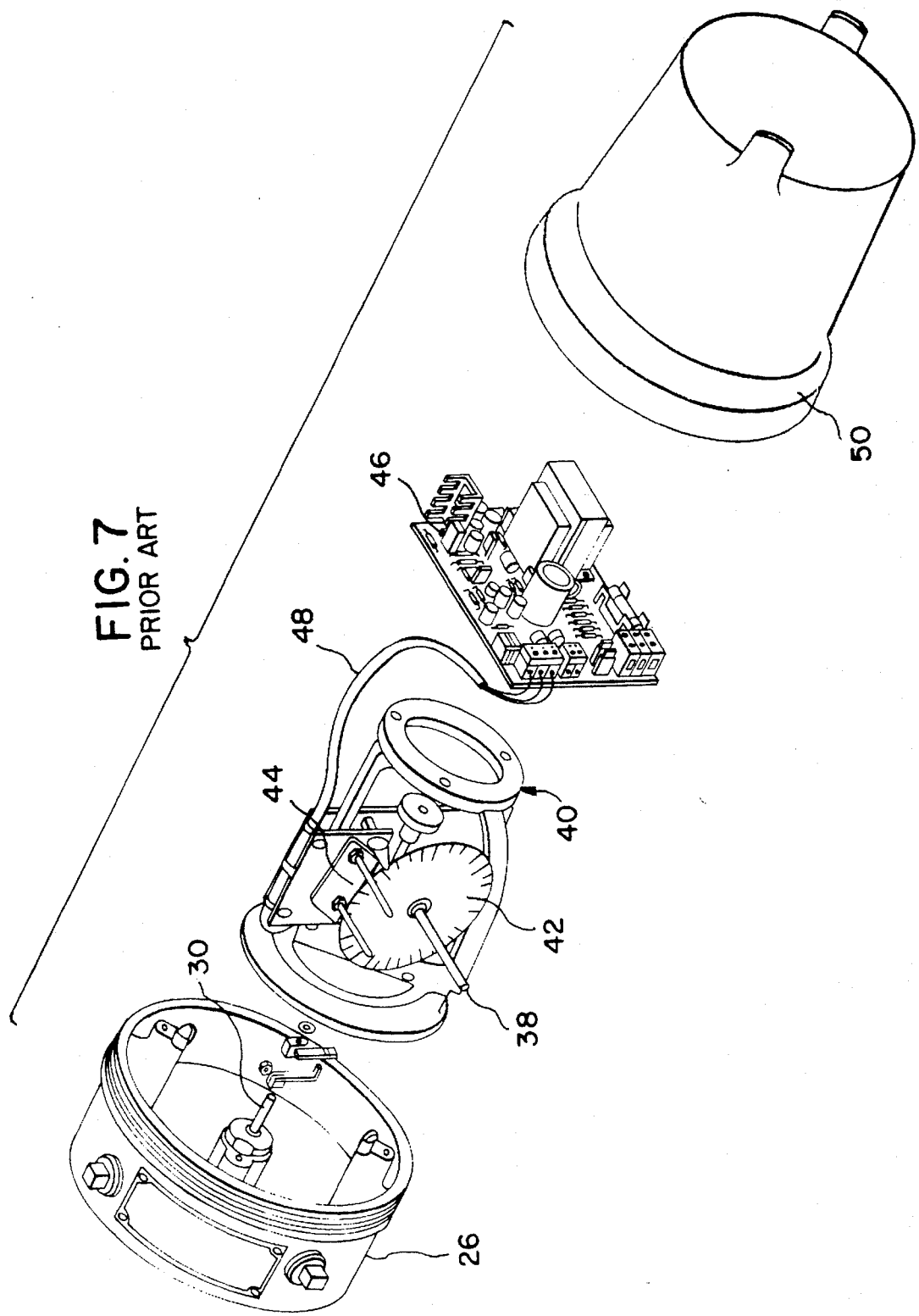
FIG. 7 is an exploded view of an analog level encoder/transmitter according to the prior art.
Figure 8:
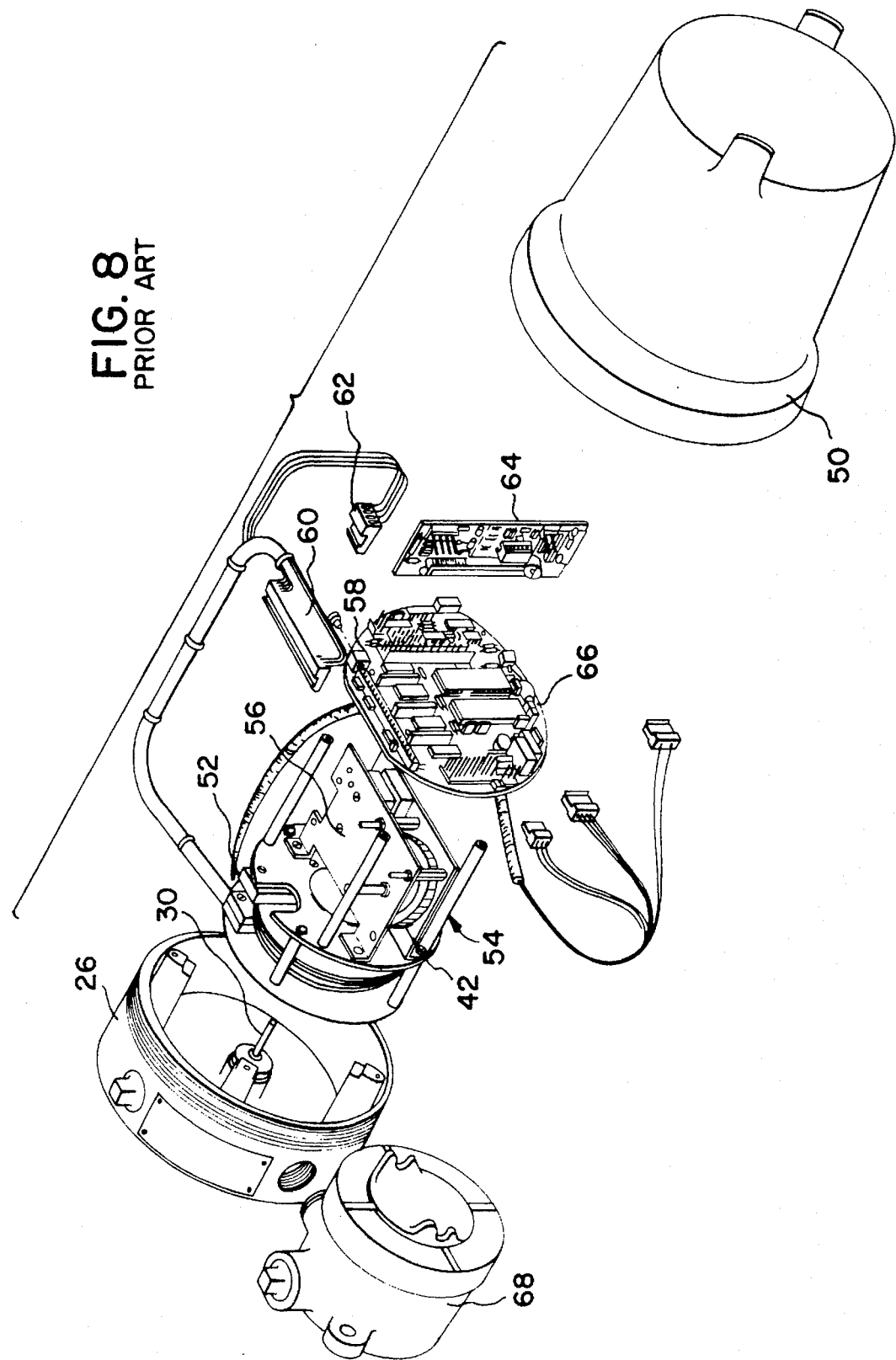
FIG. 8 is an exploded view of a digital encoder/transmitter according to the prior art.
Figure 10:
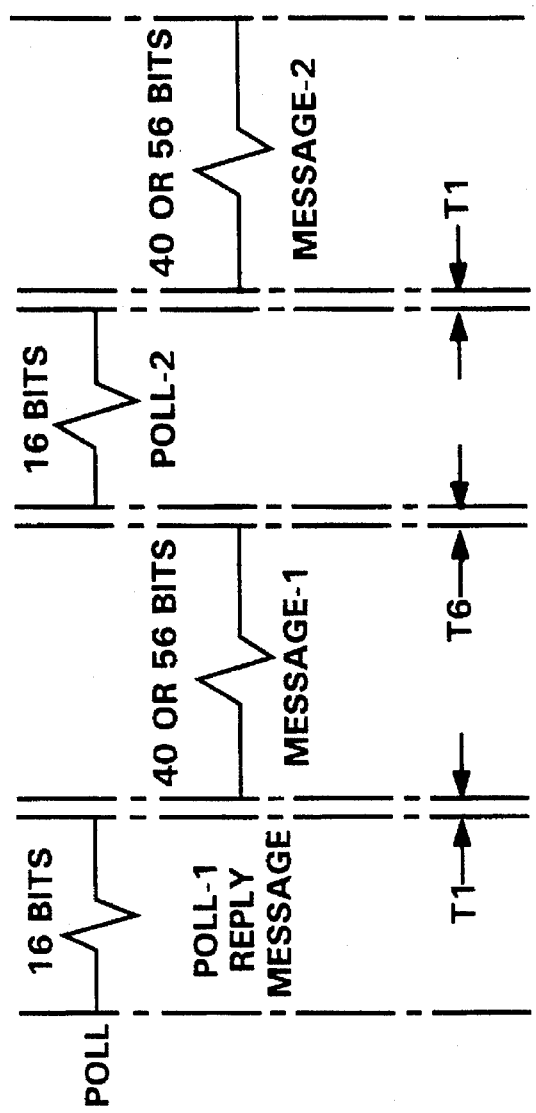
FIG. 10 is a diagram showing a typical data exchange session in a prior art gaging system.
Figure 11:
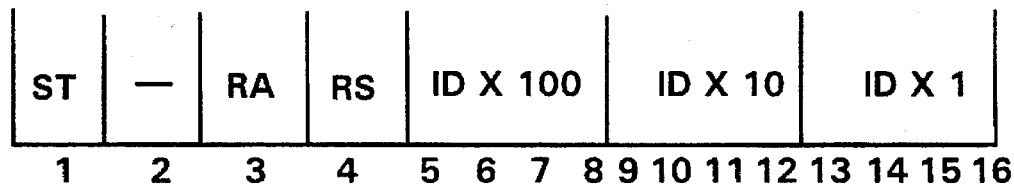
FIG. 11 is a diagram showing a typical remote acquisition device polling request in a prior art tank gaging system.
Figure 12:
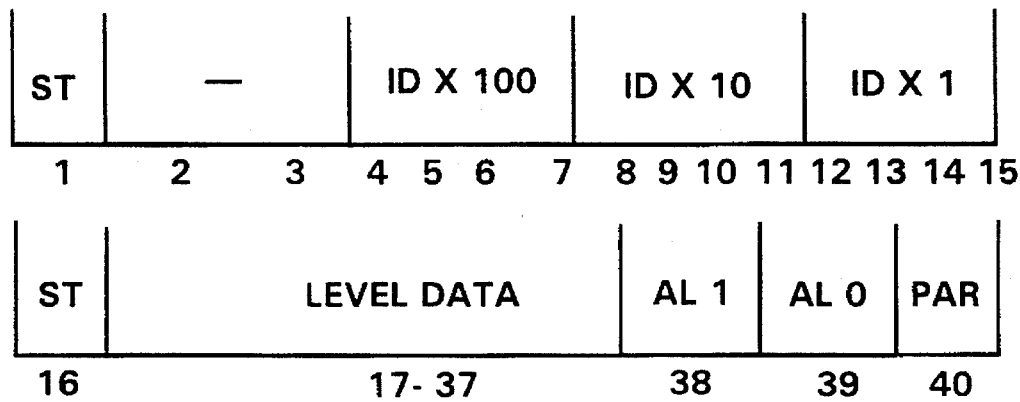
FIG. 12 is a diagram showing a typical transmitter data transmission message in a prior art tank gaging system.
Figure 13:
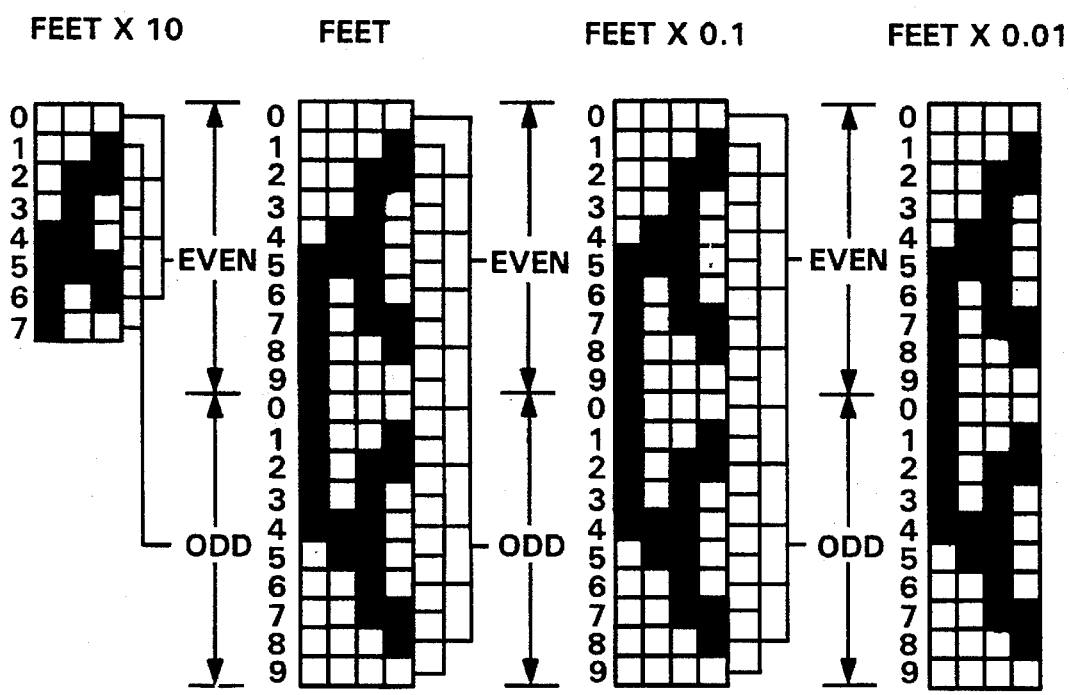
FIGS. 13–15 are charts illustrating reflected Gray code implementations in level encoders in prior art tank gaging systems.

FIG. 4D shows the float 298 of the present invention in use with an entire float assembly (e.g., see description of prior art float assembly in conjunction with FIGS. 1-3). The float 298 is shown floating on a body of liquid and has the upper rod 304 connected with an elongated flexible member in the form of measuring tape 274. It can be seen that the upper end of measuring tape 274 has its upper end passing through the tank roof 264 for connection with other components of the float assembly, and has its lower end connected with the upper rod 304 above the body of liquid.

Figure 17:
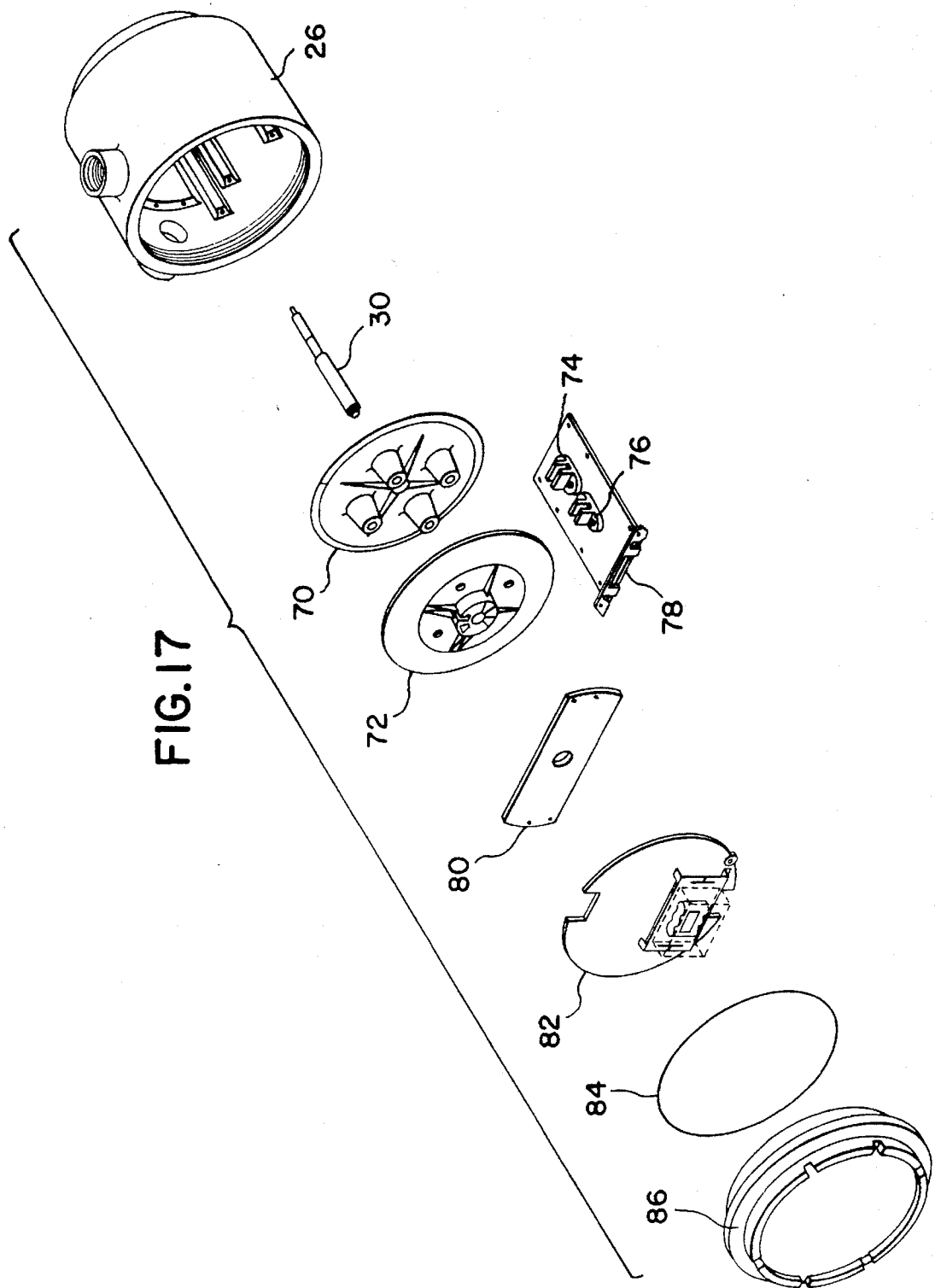
FIG. 17 is an exploded view of a level encoder according to the present invention.

A level encoder according to the present invention will now be described with particular reference to FIG. 17. In this Figure, encoder shaft 30 is disposed within encoder body 26 and is coupled to a gaugehead in a manner similar to that of the prior art. Level disk 70 and verification disk 72 are mounted on encoder shaft 30. Each of these disks are preferably made from Ultem plastic to prevent warping and moisture condensation under high and low temperature extremes.

Level photosensor unit 74 and verification photosensor unit 76 are each mounted on sensor module 78. The lower peripheral edge of level disk 70 is situated in a channel in level photosensor unit 74, and the lower peripheral edge of verification disk 72 is situated in a channel in verification photosensor unit 76.

Level photosensor unit 74 is composed of two LED/photodetector pairs, each similar to the LED/photodetector pairs used in optical-type digital level encoders of the prior art, as described above, and a channel runs through the unit between each of the LEDs and its associated photodetector. Similarly, verification photosensor unit 78 is composed of one LED/photodetector pair, and a channel runs through the unit between each of the LEDs and its associated photodetector. Level disk 70 has 128 slots cut into its peripheral edge, and verification disk 72 has 4 slots cut into its peripheral edge. The lower peripheral edge of each disk is located in the channel of its associated photosensor unit so that optical paths between each of the LED/photodetector pairs are successively made and broken as the disks are rotated by encoder shaft 30. While the LEDs in level photosensor unit 74 are operated continuously due to the rapid movement of slots on level disk 70 through the photosensor channel, slots in verification disk 72 rotate relatively slowly; thus, the LED in verification photosensor unit 76 is pulsed once every 200 mS to conserve power.

The end of encoder shaft 30 opposite the gaugehead is secured to bracket 80, which is mounted to encoder housing 26. Encoder CPU board 82 is mounted on top of bracket 80 and receives electrical signals produced by level photosensor unit 74 and verification photosensor unit 76. These signals are processed in a microprocessor on CPU board 82 to provide tank level information to an external device. Finally, the entire level encoder assembly is equipped with an O-ring 84 providing a secure seal between encoder body 26 and cover 86.

Figure 14:
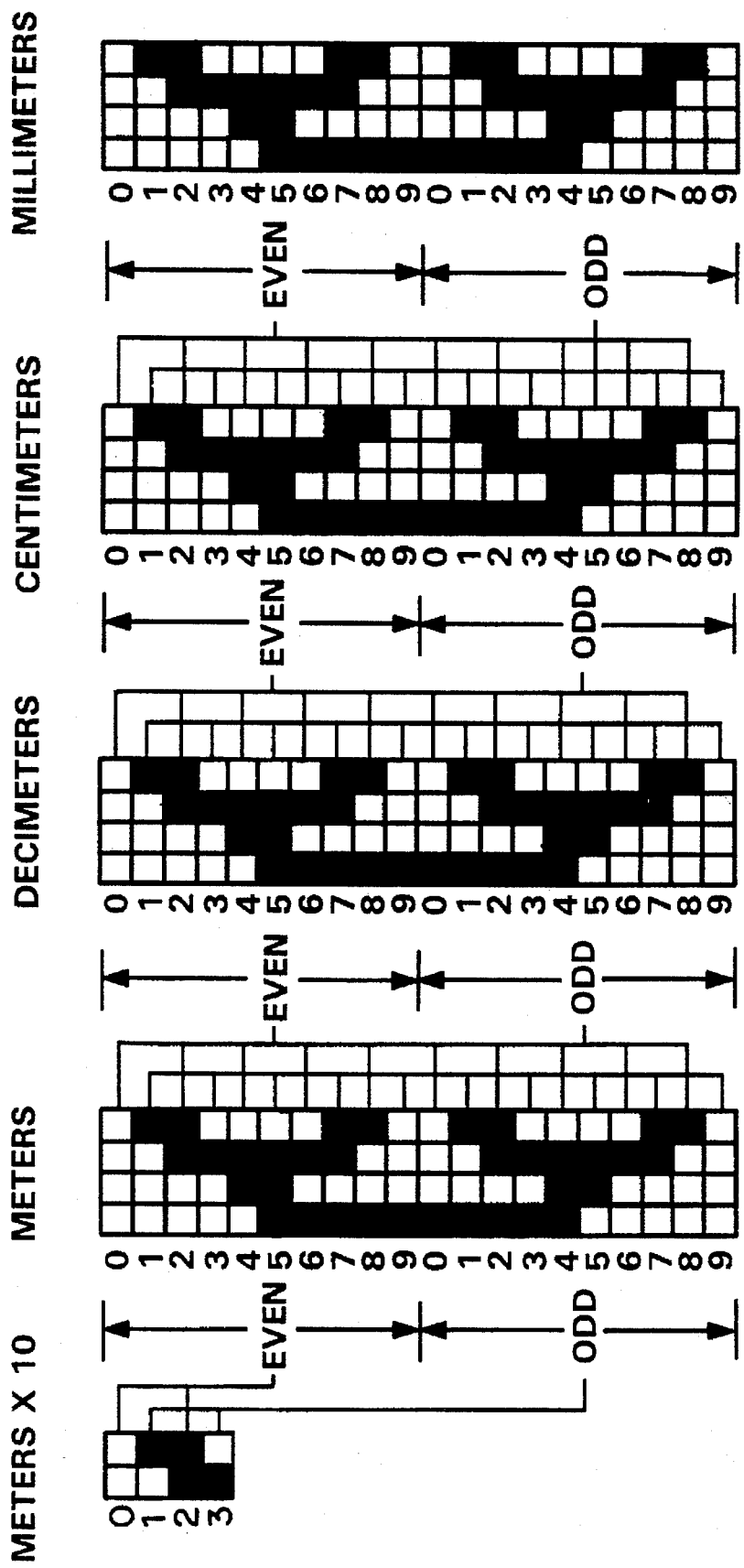
Figure 15:
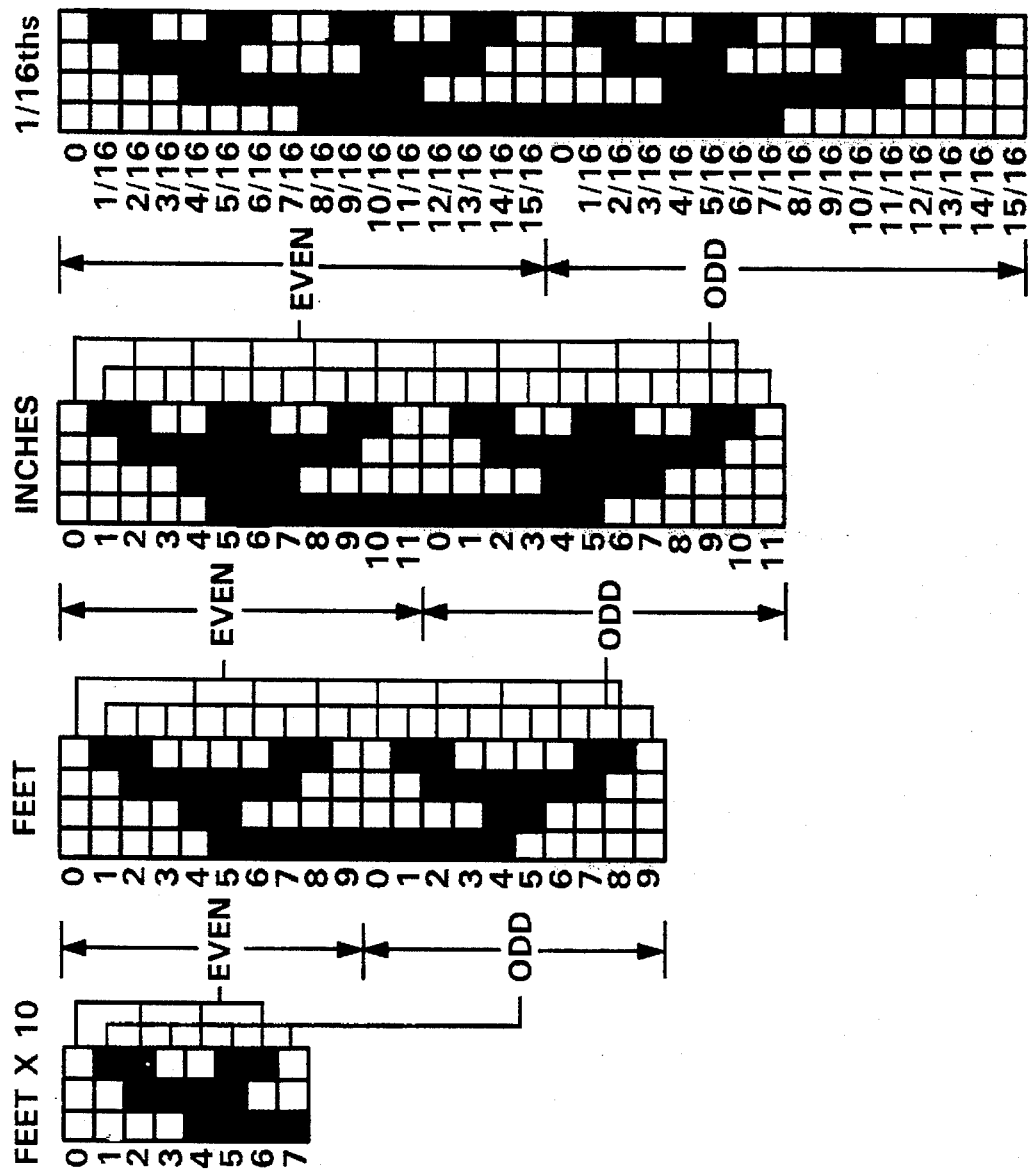
Figure 18:
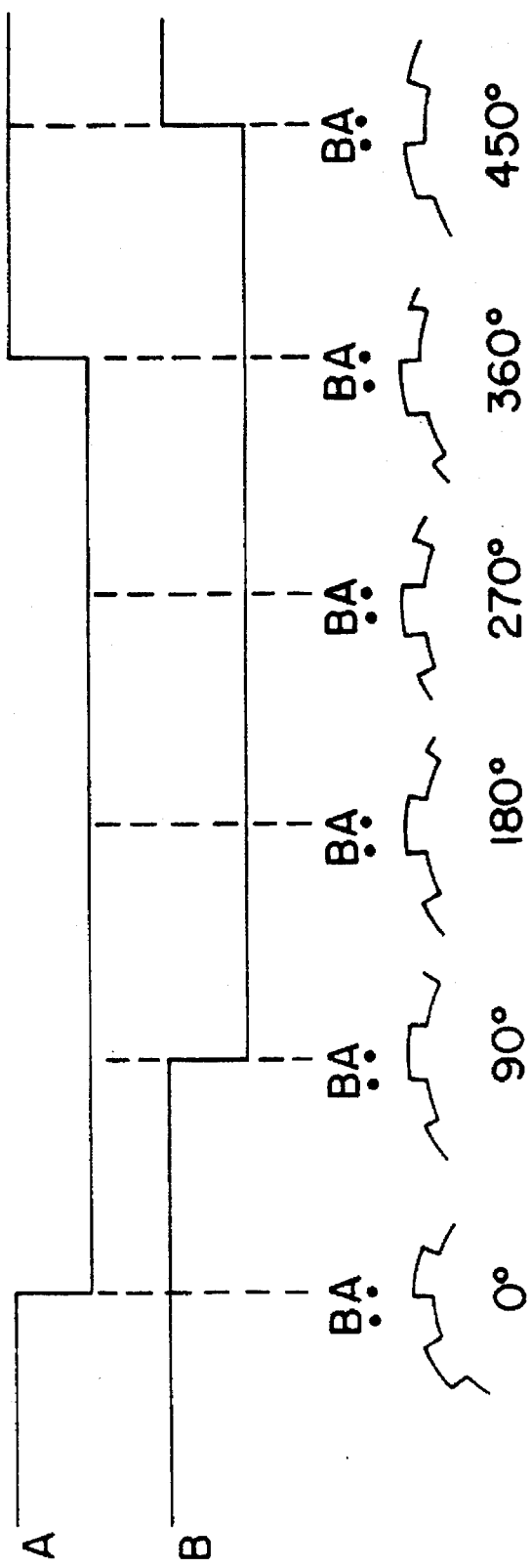
FIG. 18 is a diagram showing the phase relationship of photodetectors with a level disk in a level encoder according to the present invention.

The operation of the disks, sensors, and CPU transmitter will now be described in greater detail with particular reference to FIGS. 18 and 19. Level photosensor unit 76 is composed of two LED/photodetector pairs (referred to in FIG. 14 as A and B) whose optical axes are spaced apart at a distance equal to ¼ of the distance between slots in level disk 70. Thus, a tooth between slots on level disk 70 interrupts one LED/photodetector pair as shown at the 90° position on FIG. 18. Then, after the disk rotates through an arc equal to ¼ of the width of the tooth, the other LED/photodetector pair will be interrupted as is shown at the 180° position on FIG. 18. After ½ width turn, the light path in the first LED/photodetector pair will be re-established as shown at the 360° position on FIG. 18. After another ¼ width turn, the light path in the second LED/photodetector pair will be re-established as shown at the 450° position on FIG. 18, and another ¾ width turn will begin this process again. Thus, rotation of level disk 70 generates two square wave signals in the LED/photodetector pairs of level photosensor unit 74 which are 90° out of phase with each other. By noting which of the pairs generates the wave which leads in phase, the direction of rotation of the disk can be determined.

Alternatively, the LED/Photodetector pairs in level photosensor unit 74 may be spaced at ¾ width to provide signals 270° out of phase.

Verification disk 72 similarly interrupts an optical path between a single LED/photodetector pair in verification photosensor unit 76. Since verification disk 70 has only four slots, verification photosensor unit 76 produces four square wave pulses for each full rotation of the disks, or one pulse per quadrant of rotation.

The signals produced by the photosensor units are shaped by signal conditioner 88 and fed to encoder CPU board 82. On encoder CPU board 82, edge-triggered increment detector 90 provides a count pulse to up/down counter 92 for each slot-tooth or tooth-slot transition on level disk 70 and uses the phase difference between the photodetector outputs in the level photosensor unit 74 to provide the appropriate increment/decrement signal to counter 92. Since the increment counter produces count pulses on each edge of the slots on level disk 70 for each of the photodetector outputs in level photosensor unit 74, it supplies 512 pulses to counter 92 for each full disk rotation.

The output of counter 92 passes through isolation unit 94 to remove electromagnetic interference which may cause false readings and miscounts and is presented to microprocessor 96 by way of I/O interface 98. Microprocessor 96 receives the count data as well as the conditioned output of verification photosensor unit 76. The first time a slot in verification disk 72 makes an optical path in verification photosensor unit 76, a microprocessor interrupt is generated and the output of counter 92 is read. The count modulo 128 (i.e., the seven least significant bits) is stored in EEPROM 102, typically a 64k EEPROM memory. When a subsequent pulse is generated by verification photosensor unit 76, a microprocessor interrupt is generated and the current output of counter 92 modulo 128 is compared with the value stored in EPROM 102. Since a full disk revolution produces 512 pulses, the count difference between any two verification pulses is necessarily a multiple of one-fourth of that number, or 128. If this is not the case, microprocessor 96 signals an error condition.

Figure 20:
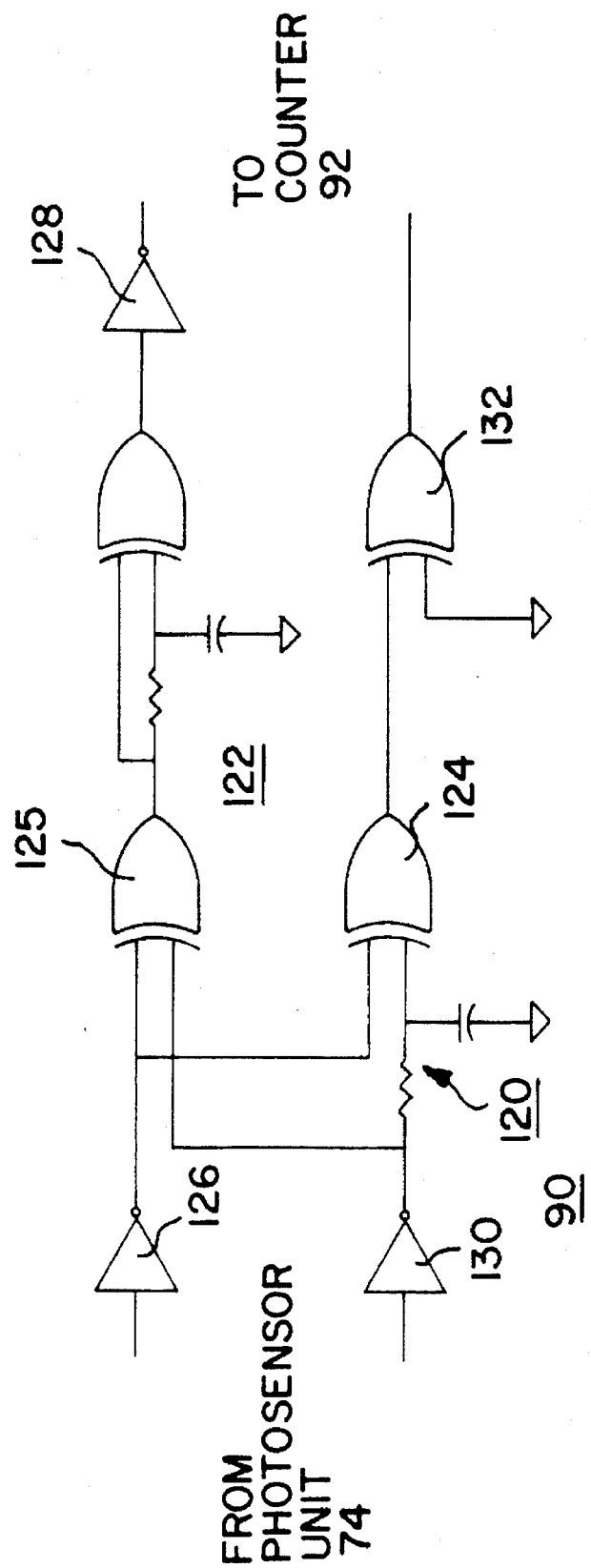
FIG. 20 is a schematic diagram of a rotation direction detection circuit in a level encoder according to the present invention.

While methods for deriving directional information from quadrature-type signals are known in the art, these methods compromise the available resolution of the measuring device (i.e., the level disk) or involve circuitry of fairly high complexity. The present invention overcomes these disadvantages by a novel circuit arrangement as illustrated in FIG. 20. Increment detector 90 includes RC circuit 120 connected to one of the photodetector outputs in level photosensor 74. RC circuit 120 is a delay designed with a time constant such that the circuit effectively forms a one-bit dynamic memory cell for the photosensor output. Increment detector 90 also includes edge detector 122 which outputs a 30 μS pulse whenever one of the photodetectors in level photosensor unit 74 detects a slot-tooth or tooth-slot transition. The output of one of the photodetectors is exclusive-OR'ed (EXORed) with the previous state of the other photodetector output as stored in RC circuit 120 by a first EXOR gate 124 to provide an increment/decrement signal to counter 92. An XOR gate 132 receives the output from XOR gate 124. A second EXOR gate 125 receives the first and second signals and generates a clock signal in response to incremental shaft rotation. Buffer inverters 126, 128, and 130 effectively perform buffering operations for the signal inputs and outputs.

Figure 19:
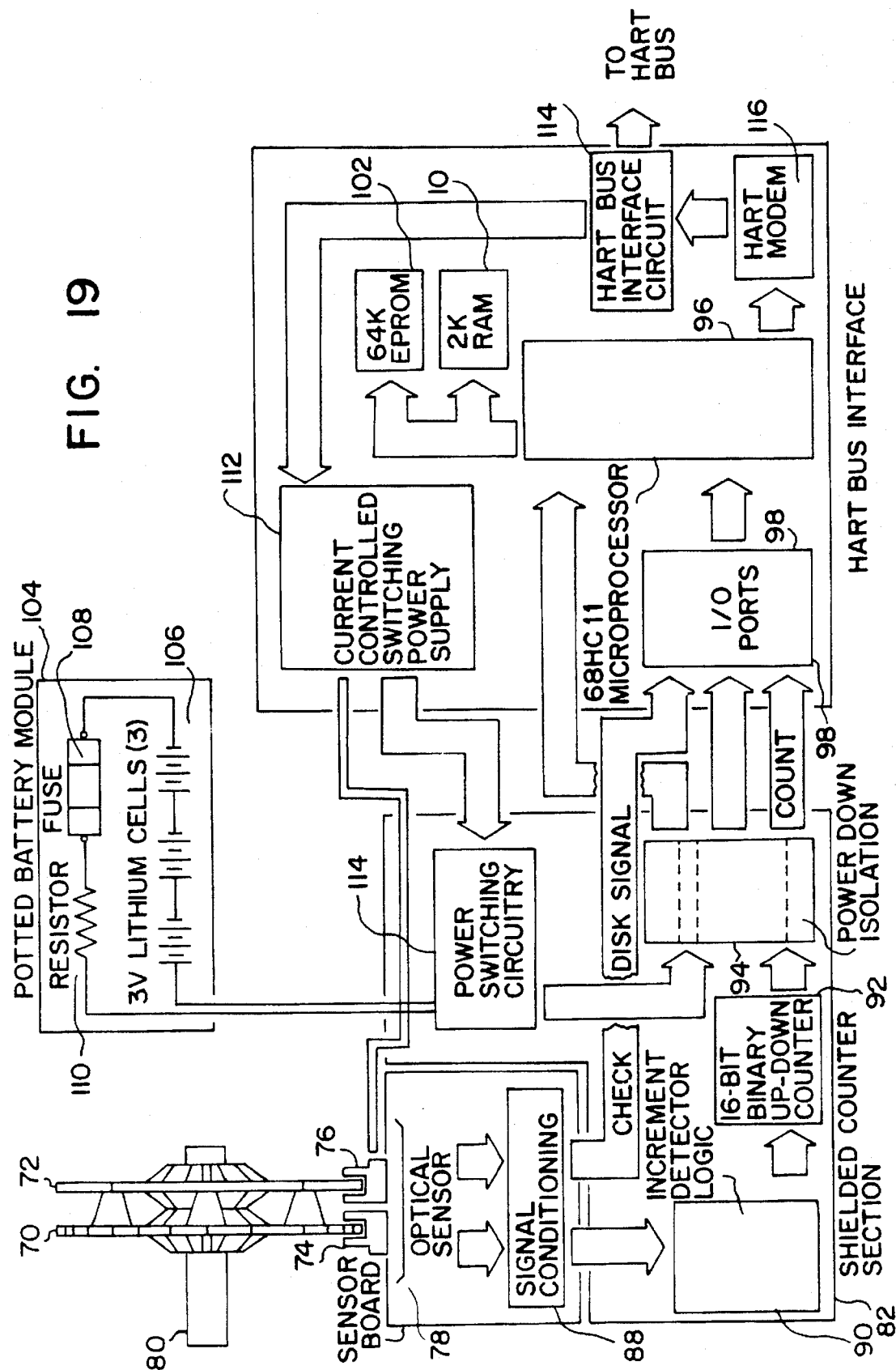
FIG. 19 is a block diagram of the electronic circuitry of a level encoder according to the present invention.

For increased reliability, the encoder may be provided with a potted backup power unit 104 comprising lithium batteries 106, fuse 108 and load 110 as shown in FIG. 19 to provide backup power in the even of a line power outage or failure of power supply 112. When main power fails, power switching unit 114 uses power from backup power unit 106 to operate the encoder and maintain the count stored in the counter.

After verification, microprocessor 96 converts the level count to appropriate units of measure and sends the resulting level to an external data bus by way of modem 116 and bus interface 118. Data on the external bus may conform to any generally accepted standard. As noted above, one protocol that has been found to work particularly well in this application is the HART protocol developed by Varec and commonly known in the art. The HART protocol uses a Bell 202-based 1200 baud Frequency Shift Keying (FSK) scheme with frequencies at 1200 Hz and 2200 Hz representing binary digits 1 and 0, respectively. Using this implementation, two-Way serial digital data may be transmitted over a 4–20 mA analog line simultaneously with analog data, since the DC component of the FSK data is 0 V.

In order for the encoder to draw power from and communicate on the HART bus, it must appear electronically as a constant current source with a very high parasitic impedance. In addition, it must be able to modulate the circuit controlling current regulation in order to communicate with the host device. The circuit comprised of U1A, Q1, Q3, D1 and their associated passive components perform this function while wasting only 3% of the power available to the encoder at a 12.5 V supply voltage.

The heart of the circuit is Q3, a high voltage (240 V) depletion mode NMOS FET (preferably a type ND2406NL device) that controls the current drawn from the HART bus. The current through the encoder is controlled by U1A which measures the voltage developed across R12, compares it with reference D1 and compensates for the difference by controlling Q3 through Q1. The comparison is made at the summing node connecting R3, R5, and U1A, pin 3 whose voltage will nominally be at 0 V relative to the internal common (D1, anode). Q1 and R15 extend the output voltage swing of U1A to its positive rail. This allows it to turn Q3 on fully if the supply voltage to the encoder falls to minimum levels. R15 and R20 guarantee that during initial power application to the circuit, enough power is available to the circuit for it to start up in a graceful manner. D4 prevents latch-up of U1A.

Modulation of the current regulator circuit is achieved by placing the attenuated FSK signal from the internal modem across pin 2 of U1A. R1, R2, R4 and associated components are responsible for this.

Figure 21:
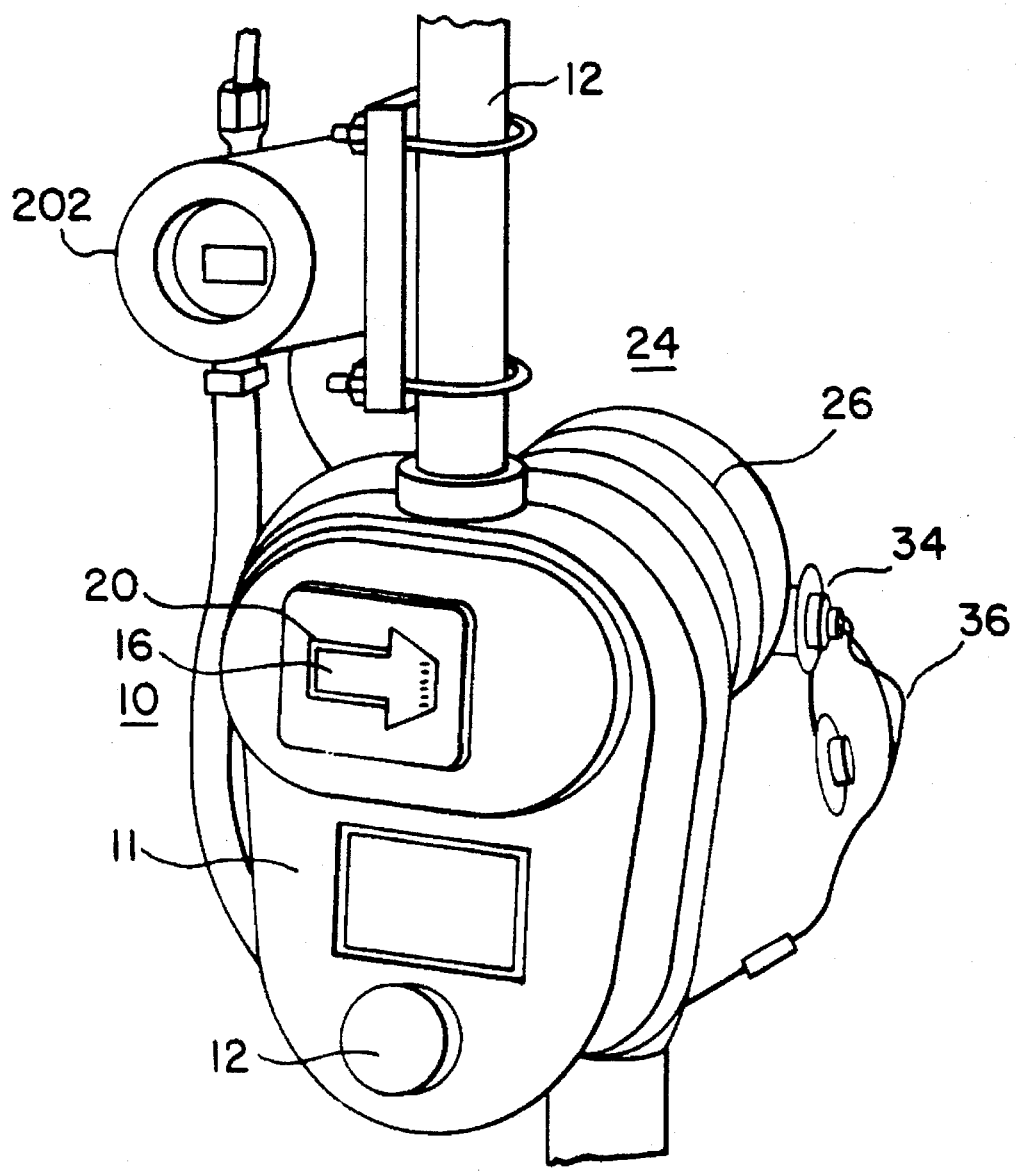
FIG. 21 shows a gaugehead/level encoder/transmitter combination according to the present invention.

The level encoder output may be sent to a separate transmitter unit via the HART bus. As shown above, prior art designs employed self-contained, integrated encoder/transmitter designs. While this arrangement provided some design and installation flexibility, each transmitter was dedicated to a single tank sensor. If an application which required sensing more than one tank parameter arose, additional transmitters were often required. The encoder design described above may be coupled to a HART-compatible remote data acquisition device and operated as a stand-alone unit, or it may be coupled to a transmitter which also sends other sensor data to a remote data acquisition unit. FIG. 21 shows such a transmitter 200 according to the present invention mounted on a prior art gaugehead similar to the one described above.

Figure 22:
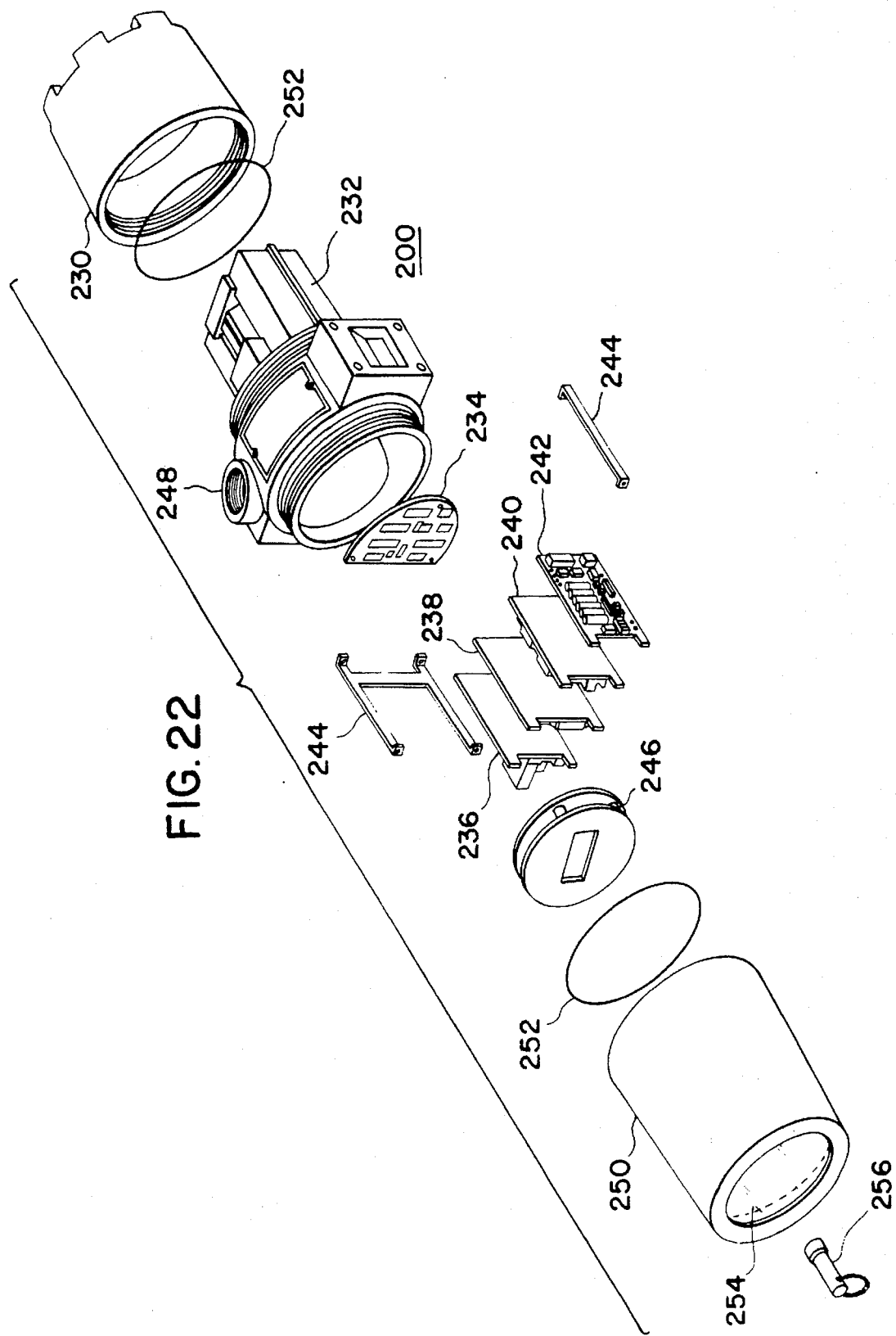
FIG. 22 is an exploded view of a gaging transmitter according to the present invention.

FIG. 22 is an exploded view of transmitter 200. In this Figure, input and output lines enter transmitter 200 through rear cover 230 and are connected to the transmitter circuitry through I.S. barrier/termination assembly 232. The input and output signals thus isolated are provided to motherboard 234, which distributes them to power supply module 236, analog module 238, CPU module 240, and communications module 242. These circuit boards are fixed in place by brackets 244. LCD readout 246 is connected to the transmitter circuitry to provide local data display of sensor measurements and calculations performed by the transmitter.

The transmitter circuitry is housed in enclosure 248, and the ends of enclosure 248 are closed off by front cover 250 and rear cover 230 with O-rings 252. LCD readout 246 is visible through a window 254 in front cover 250 and has a magnetic sensor in it. Using this sensor, an LCD readout backlight can normally be powered down until an operator places a magnetic wand 254 in close proximity to LCD readout 246, thus activating the magnetic sensor. When the sensor is activated, it enables power to LCD readout backlight, thereby displaying data. In this way, power consumption of the transmitter may be reduced.

As noted above, a temperature sensor or 4–20 mA device may bypass the HART bus and be connected directly to the transmitter. A novel method of compensating for errors in temperature measurement in a tank gaging system according to another aspect of the present invention will now be described with reference to FIG. 23. In this Figure, RTD 134 (typically a three-wire 100 Ω copper or DIN platinum device) is disposed in a tank and provides a voltage $V_2$ to analog multiplexer 136 directly at channel 2 of the multiplexer and a voltage $V_1$ to multiplexer 136 via an RTD lead 138 at channel 1.

Driven by microprocessor binary channel select means 148 in a system microprocessor, multiplexer 136 provides the above voltages as voltage $V_{mix}$ to analog/digital (A/D) converter 150 via amplifier 152 and filter 154. A/D converter 150 is a multiplying A/D converter, and reference voltage $V_{ref}$ is applied to the multiplying input 156 of the converter so that its digital output is proportional to this reference voltage. The output of A/D converter 150 is then averaged over several seconds by microprocessor count averaging means 158 to reduce the effect of spurious noise components. This technique also permits use of a non-integrating A/D converter for A/D converter 150. This average count is then processed by microprocessor computation means 160 to derive a corrected temperature and current measurement.

Channel 1 of multiplexer 136 is also connected to a reference voltage $V_{ref}$ by way of source resistance $R_s$ 140 to provide a supply current $I_s$ to the RTD according to the following equation:

$$I_s = \frac{(V_{ref} - V1)}{R_s}$$

Thus, the RTD lead resistance $R_{lead}$ is determined by:

$$R_{lead} = \frac{(V_1 - V_2)}{I_s}$$

Reference ratio generator 142 provides two reference voltages and $V_5$ to multiplexer 136 via channels 4 and 5, respectively, where $$V_4 = \frac{V_{ref}}{M}$$

and $$V_5 = \frac{2V_{ref}}{M}$$

where M is a given ratio Constant. Multiplexer 136 may also have one or more auxiliary sensor lines for accommodating standard 4–20 mA sensors as shown at channel 3 of multiplexer 136, where a sensor 144 having a termination resistance $R_t$ 146 provides voltage $V_3$ to multiplexer 136.

Figure 23:
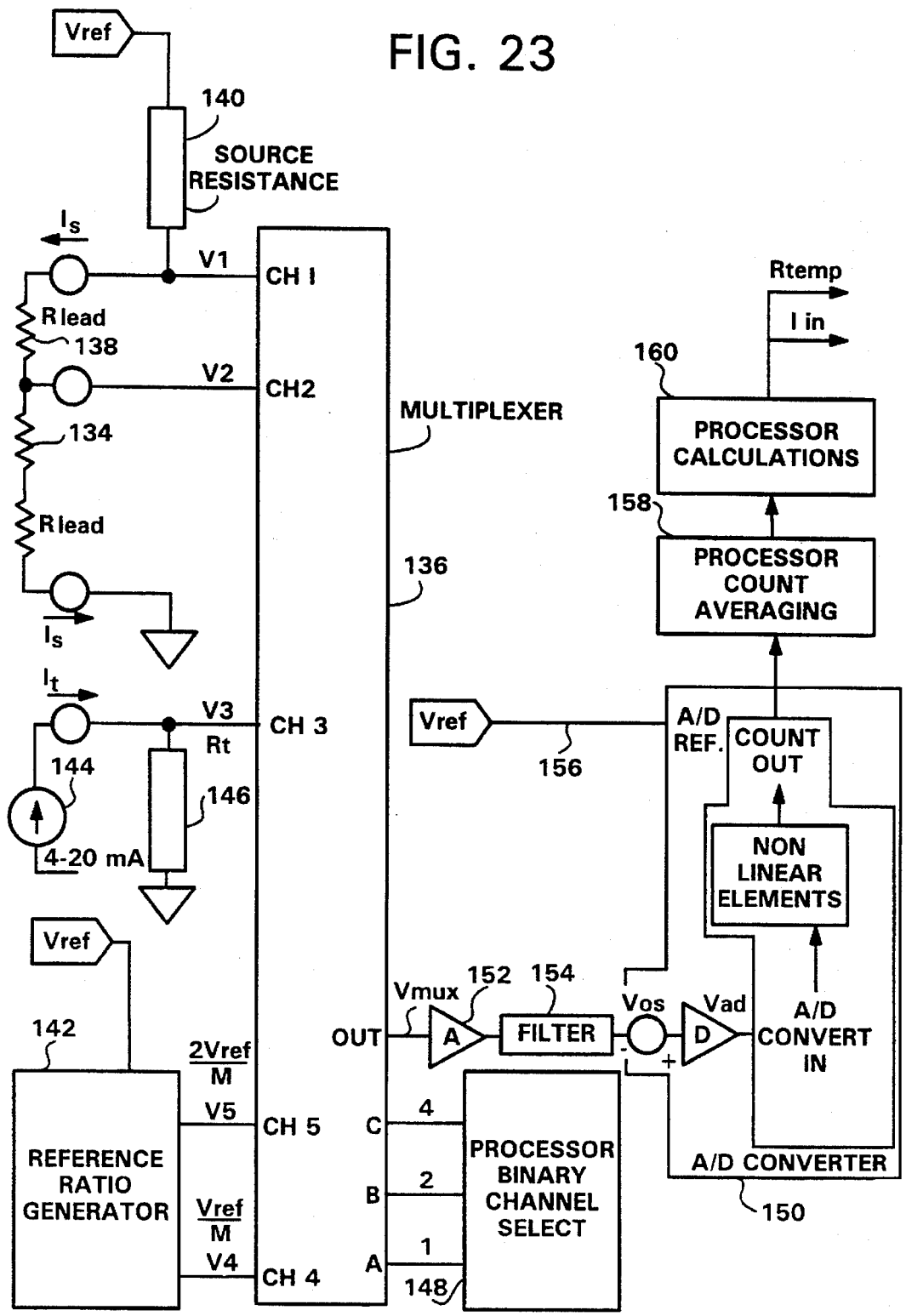
FIG. 23 is a block diagram of an error-compensated temperature measurement system according to the present invention.
Figure 25C:
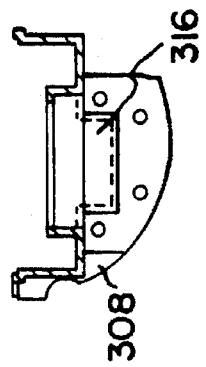
FIGS. 25A–25F are views of a housing for an I.S. lightning barrier/termination block assembly according to the present invention.
Figure 25B:
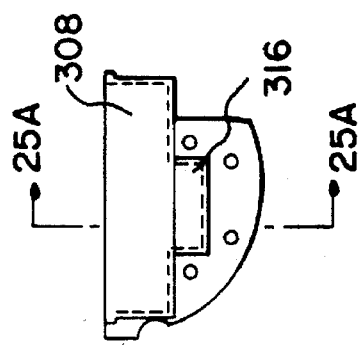
Figure 25A:
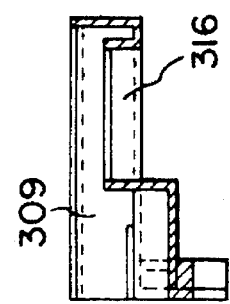
Figure 25F:
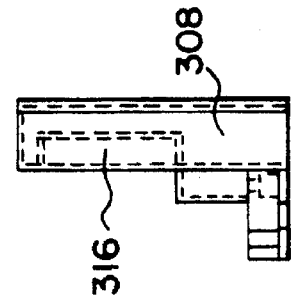
Figure 25E:
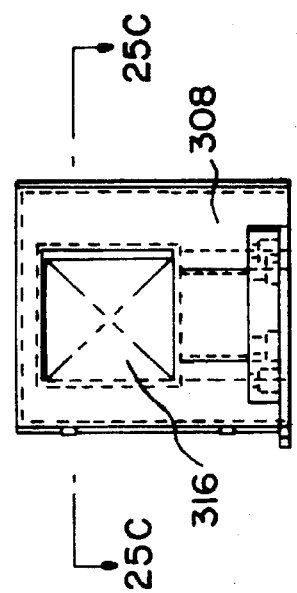
Figure 25D:
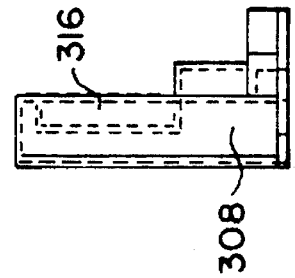

With reference to FIG. 23, the voltages $V_1$ and $V_2$ at channels 1 and 2 of the multiplexer are given by $$V_1 = I_t(R_{temp} + 2R_{lead}) \quad (1)$$

$$V_2 = I_t(R_{temp} + R_{lead}) \quad (2)$$

where $I_t$=RTD current;

$R_{temp}$=RTD resistance; and $R_{lead}$=RTD lead resistance.

To cancel the effect of matched lead resistances, equations (1) and (2) may be substituted into the relationship $$2V_2 - V_1 = I_t \cdot R_{temp}$$

to obtain $$R_{temp} = \frac{2V_2 - V_1}{I_t} = R_s \cdot \frac{2_{v2} - V_1}{V_{ref} - V_1}$$

The voltage $V_3$ at channel 3 of the multiplexer from the auxiliary device is $$V_3 = R_1 \cdot I_{in}$$

where $I_{in}$=auxiliary device input current; and $R_1$=auxiliary device termination resistance.

A/D converters generally have a slight nonlinearity in their gain and in the resultant count. This nonlinearity may be corrected by a correction factor of the form $$N_x|_{corr} = \sum_{k=0}^{n} (C_k \cdot N_x|_{rdg}^k)$$
$$= C_0 + C_1 \cdot N_x|_{rdg} \ldots + C_n \cdot N_x|_{rdg}^n$$

where $C_k$=multiplying constant coefficients;

$N_x|_{corr}$=calculated corrected count of A/D due to voltage at $V_{mux}$; and $N_x|_{rdg}$=observed count reading of A/D due to voltage at $V_{mux}$.

The curve may be satisfactorily approximated by its first two terms:

$$N_x|_{corr} = C_0 + C_1 \cdot N_x|_{rdg}$$

or $$N_x|_{corr} = K(N_x|_{rdg} - N_{off})$$

where $K = C_1$=gain correction factor; and $C_0 = -K \cdot N_{off}$=actual count offset due to voltage $V_{os}$. Thus, $$N_x|_{corr} = K(N_x|_{rdg} - N_{off}) \quad (3)$$

The actual A/D counts may be expressed by $$N_x|_{rdg} = N_{off} + N_{max} \cdot \frac{A \cdot V_{mux}}{V_{ref}} \quad (4)$$

where

A=actual circuit gain ($V_{ad}/V_{mix}$);

$N_x$=A/D count resulting from $V_{mux}$;

$N_{off}$=fixed A/D count due to offset $V_{os}$;

$N_{max}$=maximum A/D count at $V_{ad}=V_{ref}$;

$V_{mux}$=multiplexer output voltage; and $V_{ref}$=A/D positive reference voltage.

$N|_{corr}$ should also conform to the equation $$N_x|_{corr} = \frac{G \cdot V_{mux}}{V_{ref}} \cdot N_{max}$$

where

G=desired effective gain setting;

$N_{max}$=maximum A/D count at $V_{ad}=V_{ref}$;

$V_{mux}$=multiplexer output voltage;

$V_{ref}$=A/D positive reference voltage; and $N_{xlcoff}$=A/D count corrected for gain and offset errors at $V_{mux}=V_x$.

Gain correction factor K may be determined by comparing the theoretical counts for reference voltages $V_4$ and $V_5$ to the actual readings:

$$K = \frac{(N_5-N_4)|_{req}}{(N_5-N_4)|_{rdg}}$$

where $(N_5-N_4)|_{req}$=required count difference due to desired circuit gain G; and $(N_5-N_4)|_{rdg}$=actual count difference due to actual circuit gain A.

Since the fixed offset term $N_{off}$ cancels out when count difference $N_5-N_4$ is taken, gain correction factor K is proportional to the gains G and A:

$$K = \frac{G}{A}$$

Substituting G for A and inserting reference voltages $V_4$ and $V_5$ into equation 10, $(N_5-N_4)|_{req}$ may be calculated by selecting a value for G. K may then be determined using actual readings for $N_4$ and $N_5$:

$$K = \frac{(N_5-N_4)|_{req}}{N_5|_{rdg} - N_4|_{rdg}}$$

$$= \frac{(2V_{ref}/M - V_{ref}) \cdot G \cdot N_{max}/V_{ref}}{N_5 - N_4}$$

Simplifying, $$K = \frac{G \cdot N_{max}}{M \cdot (N_5 - N_4)} = \frac{G}{A}$$

where

G=desired fixed circuit gain;

M=$V_{ref}$ source reduction ratio;

$N_4$=actual count due to $V_{mix}=V_4$;

$N_5$=actual count due to $V_{mux}=V_5$;

$N_{max}$=maximum A/D count at $V_d=V_{ref}$; and

K=gain correction factor.

$N_{off}$ may also be calculated using equation 4 by observing the actual value of $N_4$ when $V_{mux}=V_4=V_{ref}/M$:

$$N_4 = N_{off} + \frac{V_{ref}}{M} \cdot A \cdot \frac{N_{max}}{V_{ref}} = N_{off} + \frac{A \cdot N_{max}}{M}$$

where $N_4$ is the actual observed A/D count at $V_{mux}=V_4$. From equation 5, $$A = \frac{M \cdot (N_5 - N_4)}{N_{max}}$$

Combining these two equations, $N_{off}$ may be expressed by $$N_{off}=N_4-(N_5-N_4)=2N_4-N_5$$

Substituting into equation 3, $$N_{x|corr} = \frac{G \cdot N_{max}}{M \cdot (N_5 - N_4)} \cdot [N_x - (2N_4 - N_5)]$$

where

G=desired effective gain setting;

M=$V_{ref}$ test source reduction ratio;

$N_4$=actual A/D count at $V_{mux}=V_4$;

$N_5$=actual A/D count at $V_{mux}=V_5$;

$N_{max}$=maximum A/D count at $V_{ad}=V_{ref}$;

$N_x$=actual A/D count at $V_{mux}=V_x$; and $N_{xlcorr}$=A/D count corrected for gain and offset errors at $V_{mux}=V_x$. Rearranging equation 3 as $$\frac{V_x}{V_{ref}} = \frac{N_{x|corr}}{G \cdot N_{max}}$$

and combining with the above equation gives $$\frac{V_x}{V_{ref}} = \frac{N_x + (N_3 - 2N_4)}{M \cdot (N_5 - N_4)}$$

or $$V_x = \frac{N_x + (N_5 - 2N_4)}{M \cdot (N_5 - N_4)} \cdot V_{ref}$$

Combining this equation with equation 1 gives $$R_{temp} = R_s \cdot \frac{\frac{2V_2}{V_{ref}} - \frac{V_1}{V_{ref}}}{1 - \frac{V_1}{V_{ref}}}$$

$$R_{temp} = R_s \cdot \frac{\frac{2(N_2+N_5-2N_4)}{M \cdot (N_5-N_4)} - \frac{(N_1+N_5-2N_4)}{M \cdot (N_5-N_4)}}{1 - \frac{N_1+N_5-2N_4}{M \cdot (N_5-N_4)}}$$

$$R_{temp} = R_s \cdot \frac{2N_2 + 2N_5 - 4N_4 - N_1 - N_5 + 2N_4}{M \cdot (N_5 - N_4) - N_1 - N_5 + 2N_4}$$

Combining terms results in $$R_{temp} = R_s \cdot \frac{2N_2 - N_1 + N_5 - 2N_4}{(M-1)N_5 - (M-2)N_4 - N_1}$$

where $N_1$=A/D count at $V_{mux}=V_1$;

$N_2$=A/D count at $V_{mux}=V_2$;

$N_4$=A/D count at $V_{mux}=V_4$;

$N_5$=A/D count at $V_{mux}=V_5$;

M=$V_{ref}$ reduction ratio;

$R_{temp}$=RTD resistance value; and $R_s$=RTD source resistance.

This result is independent of the A/D converter reference voltage $V_{ref}$, A/D converter voltage offset count $N_{off}$, and gains A and G.

For the auxiliary 4–20 mA input, the following expressions may be similarly derived:

$$V_x = \frac{N_x + (N_5 - 2N_4)}{M \cdot (N_5 - N_4)} \cdot V_{ref}$$

$$I_{in} = \frac{V_{ref} \cdot (N_3 + N_5 - 2N_4)}{M \cdot R_1 \cdot (N_3 - N_4)}$$

where $I_{in}$=4–20 mA input current;

M=$V_{ref}$ reduction ratio;

$N_3$=A/D count at $V_{mux}$=$V_3$;

$N_4$=A/D count at $V_{mux}$=$V_4$;

$N_5$=A/D count at $V_{mux}$=$V_5$;

$R_1$=4–20 mA termination resistance; and $V_{ref}$=A/D reference voltage.

This expression is dependent on $V_{ref}$; however, it is independent of voltage offset count $N_{off}$ and gain factors A and G.

Thus, errors introduced by amplifier and A/D converter gain and voltage offset errors and non-linearities are cancelled due to the compensating adjustments made by the multiplying A/D converter and the computations made by the microprocessor.

The count averaging system implemented by microprocessor 158 will now be described in more detail. Microprocessor 158 maintains five register groups, each being associated with one of count variables $N_1$–$N_5$ as follows:

Group 1—Channel 1—RTD source voltage count;

Group 2—Channel 2—RTD input voltage count;

Group 3—Channel 3—4–20 mA input current count;

Group 4—Channel 4—low calibrate voltage count; and

Group 5—Channel 5—high calibrate voltage count.

Groups 1, 2, 4 and 5 each contain eleven registers. The first ten registers hold the ten most recent count readings for the associated channel number. Register 11 contains the average of the group count. Its value is the sum of registers 1–10 divided by 10. Group 3 contains one register only. This is the 4–20 mA input and is not to be averaged.

The multiplexer channels are scanned in sequence. Each time a channel is set, a time delay of 0.95 seconds is required before the A/D converter may be read so that it may settle. The first A/D reading after each delay is used to clear the A/D logic, but its value is disregarded since it may not be current. A second A/D reading is required to obtain a valid count value. Using this arrangement, channels 1–5 are read at initialization and these readings are loaded into the register groups as the first count value for their respective groups. The channels are read nine more times to provide values for the rest of the registers in each register group, and the readings are then averaged. To reduce data acquisition time, readings of $N_4$ and $N_5$ may be alternated, since these are reference values and should be fairly stable.

A novel lightning and surge protector 232 according to another aspect of the present invention will be described with reference to FIGS. 24–28. This lightning protector is designed to isolate a transmitter interface for implementing the Mark/Space protocol; however, it may be adapted for use with any other applicable type of external connection.

FIGS. 24A–24D show I.S. barrier/termination assembly 232 in greater detail. Field terminal block board 304 and HART terminal block board 306 are glued into the interiors of field-side terminal block half 308 and HART-side terminal block half 310, respectively. Boards 304 and 306 may be affixed to their respective terminal block halves using cyanoacrylate ("super glue") or a similar adhesive. Field terminal block board 304 has field terminal connection block 312 mounted thereon, and HART terminal block board 306 has HART connection block 314 mounted on it so that when the boards are glued to their respective terminal block halves, field terminal connection block 312 protrudes through a hole 316 in the side of field terminal block half 308 and HART connection block 314 protrudes through a similar hole in HART terminal block half 310 to provide external connections to the Mark/Space bus and the HART bus, respectively.

Once field terminal block board 304 has been mounted on field-side terminal block half 308 and HART terminal block board 306 has been mounted on HART-side terminal block half 310 and the outputs from the boards are connected to their respective terminal block connection screws, the terminal block halves are glued together. A potting compound is then used to fill the interior volume formed by the two halves. The potting compound may be any substance suitable for this purpose, such as an epoxyhardener mixture in a ratio of 12–14:1.

Once the terminal block housing has been potted, a conformal coating is applied to the bottom face of the housing unit and the entire assembly is then mounted on base plate 312. Connections to the Mark/Space lines and the HART bus are made through the appropriate connection blocks, and the terminal ends of field terminal block board 304 and HART terminal block board 306 are plugged into connectors on the transmitter circuit boards to provide connections to the transmitter circuitry.

FIGS. 25A–25F provide top and side views of field terminal block half 308 which more clearly show its construction. HART terminal block half 310 has a similar structure.

Figure 26:
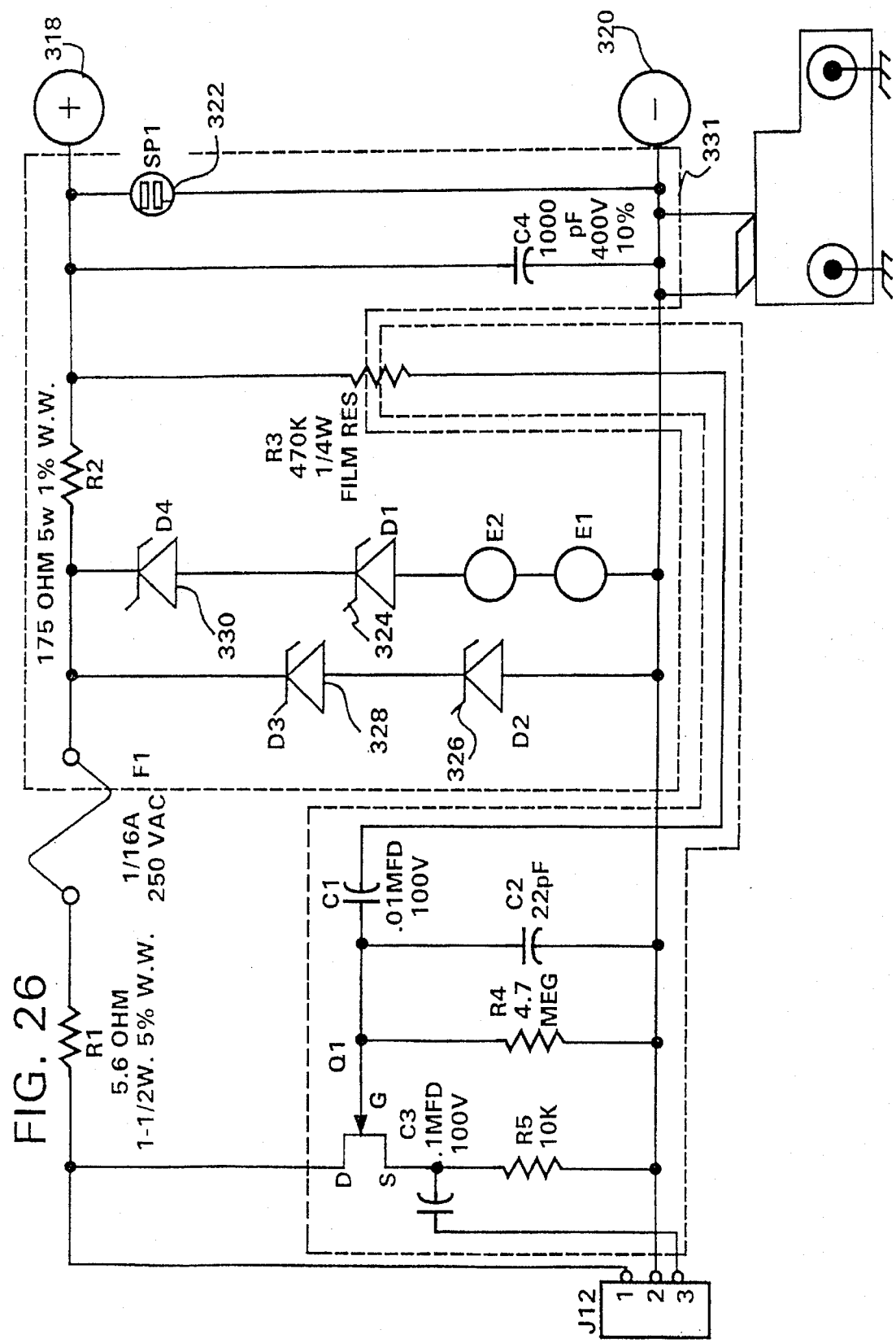
FIG. 26 is a schematic diagram of a HART-side lightning barrier/termination block assembly according to the present invention.

FIG. 26 is a schematic diagram of the HART-side section of the I.S. barrier circuitry. In this Figure, the HART+ line 318 and the HART– lien 320 each are clamped by high energy absorption gas spark tube 322 capable of carrying instantaneous currents in excess of 1000 amps. The spark tube limits differential voltages on these lines to 200 V during the duration of aline surge. The HART– line is connected to earth ground by ground block. Energy in excess of intrinsically safe levels on the HART+ line is shunted to the HART– line and thus, to earth ground. The HART+ line is connected to the HART– line by Zener diodes 324, 326, 328 and 330. It should be appreciated that all circuitry inside dotted line 331 is placed within the potted housing. Traces are at least 2 mm from each other and circuitry located outside the dotted lines.

Figure 27A:
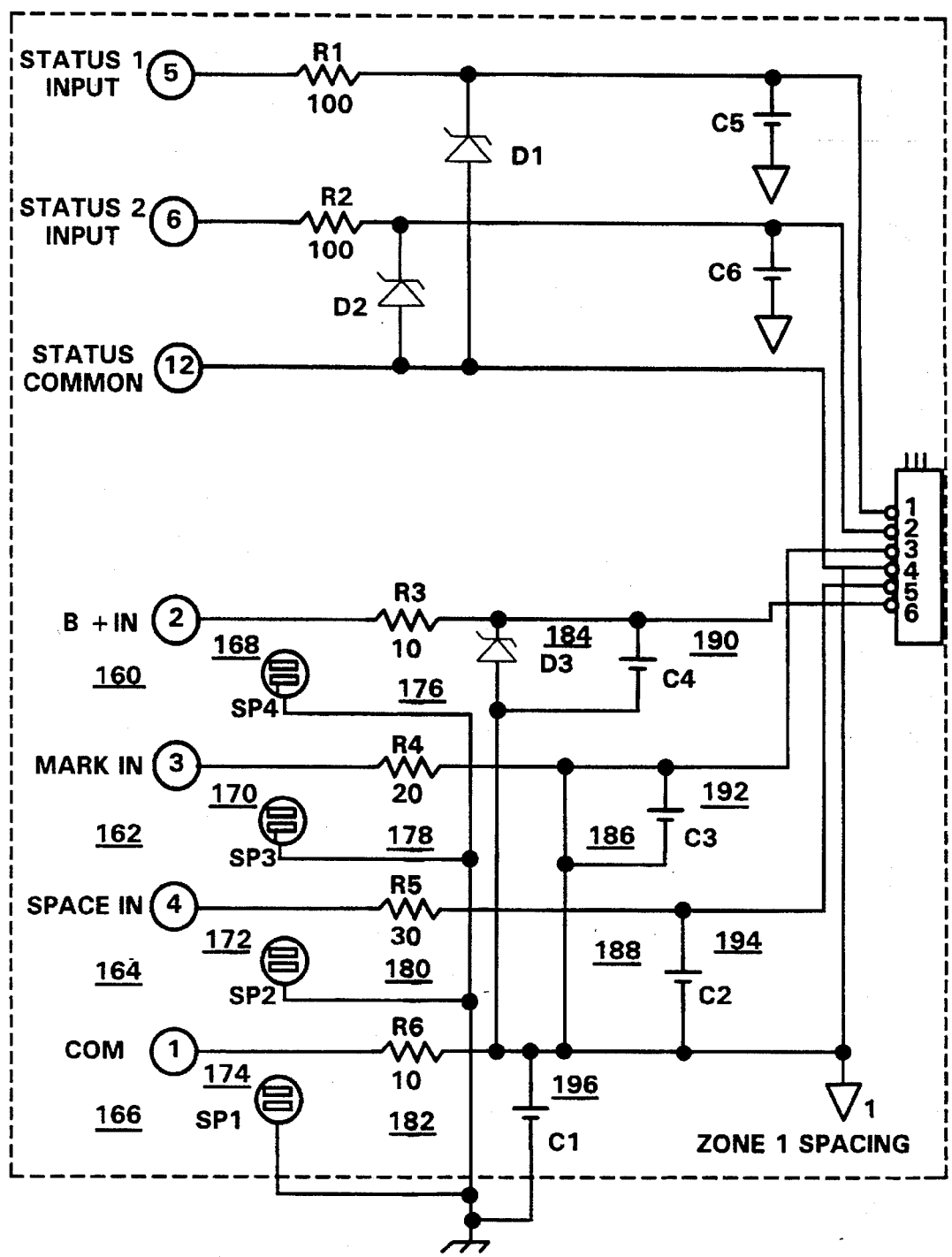
FIGS. 27A–27B are schematic diagrams of Mark/Space and RTD Circuits for a field-side lightning barrier/termination block assembly according to the present invention.

FIG. 27A is a schematic diagram of the Mark/Space section of the field-side lightning circuitry. In this Figure, the B+ line 160, the Mark line 162, the Space line 164, and the B– line 166 are each clamped to earth ground by high energy absorption gas spark tubes 168, 170, 172 and 174, respectively. The spark tubes limit differential voltages on these lines to 200 V during the duration of a line surge. The B+ mark and space lines are clamped by 1.5 kW transzorbs 184, 186 and 188, respectively, to the B– (com) line. These devices limit differential voltages on the lines to 75 V and are protected from long-term transient failure by the preclamping of the spark tubes. The RC circuits formed by the combinations of resistors 176, 178, 180 and 182 and capacitors 190, 192, 194 and 196 filter RF signals on the lines and limit the slew rate of the lines. The entire lightning protector circuit is mounted on a printed circuit board in close proximity to external connection terminals to control lead inductances, and the entire assembly is hard potted into the terminal block housing with a circuit board containing an intrinsic safety barrier.

Figure 27B:
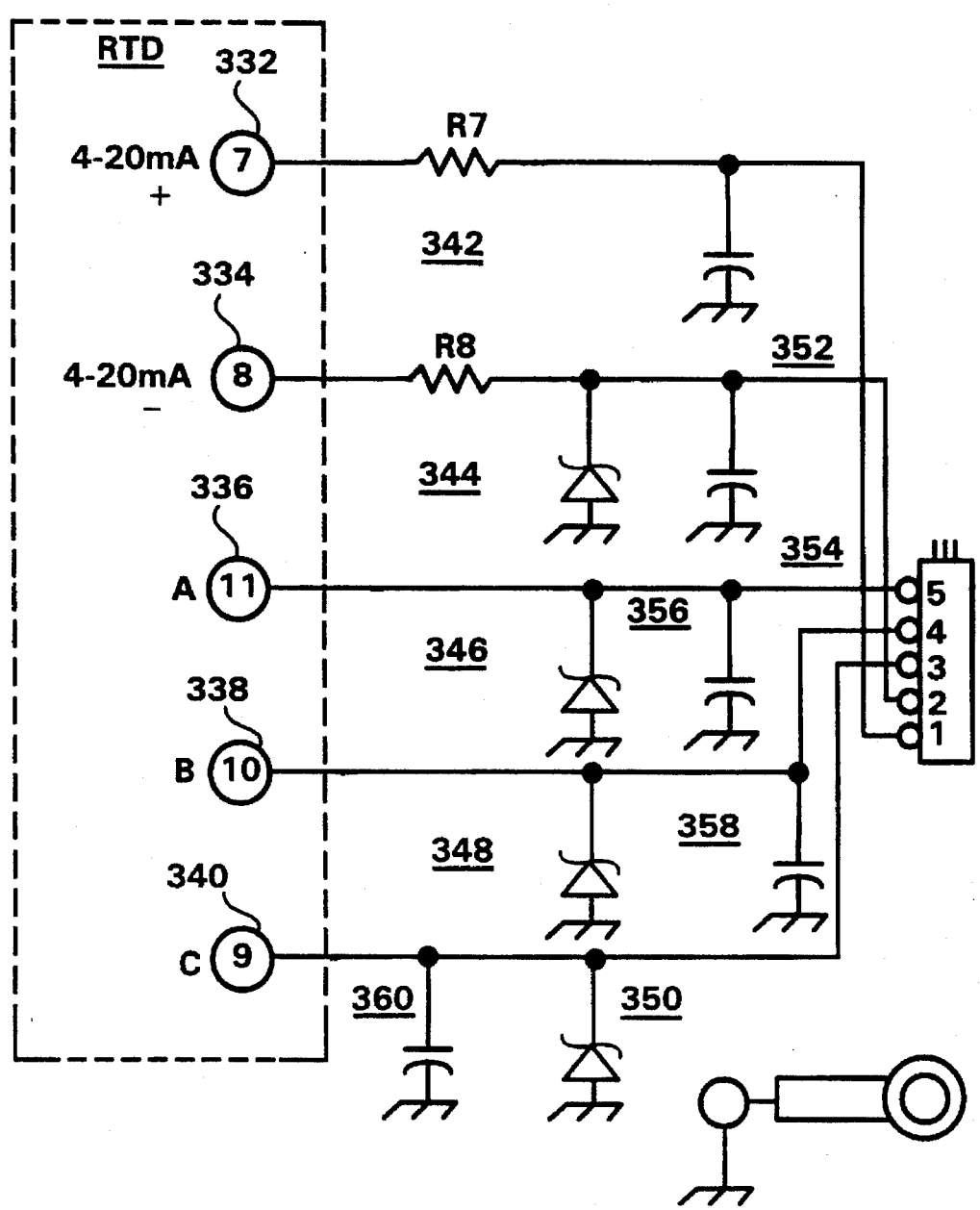

FIG. 27B is a schematic diagram of the RTD section of the field-side I.S. lightning barrier circuitry. In this Figure, 4–20 mA+ line 332 is connected to ground by voltage-variable resistor 342, while 4-20 mA- line 334, RTD-A line 336, RTD-B line 338, and RTD-C line 340 are each clamped to earth ground by Zener diodes 344, 346, 348, and 350, respectively. The input lines are FIG. 28A gives preferred values for components in the circuit of FIG. 26, while FIG. 28B gives preferred values for components in the circuit of FIGS. 27A and 27B.

Figure 29C:
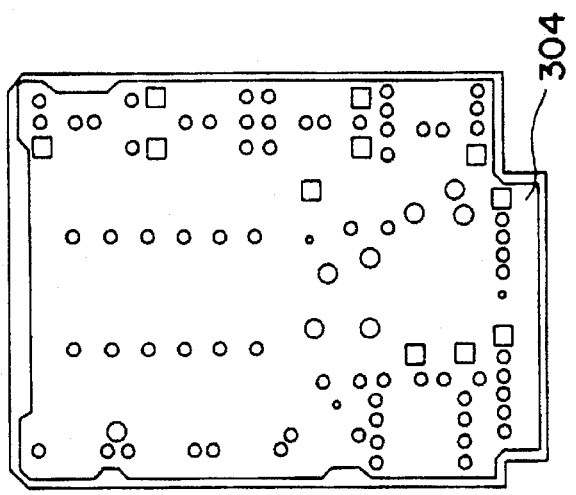
FIGS. 29A–29C show a solder-side view, component side view, and drill pattern, respectively, for a printed circuit board for the field-side circuit shown in FIGS. 27A–27B.
Figure 29B:
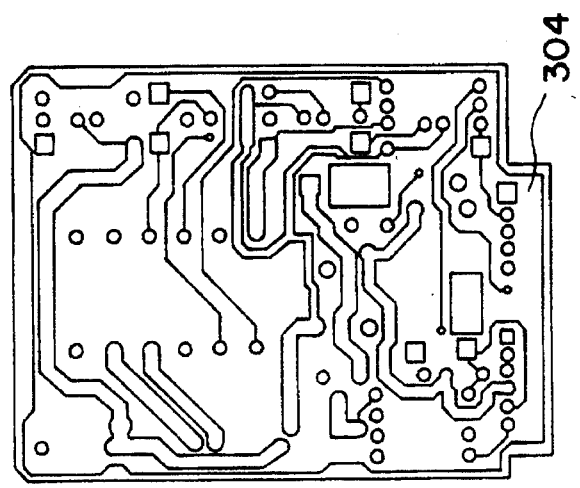
Figure 29A:
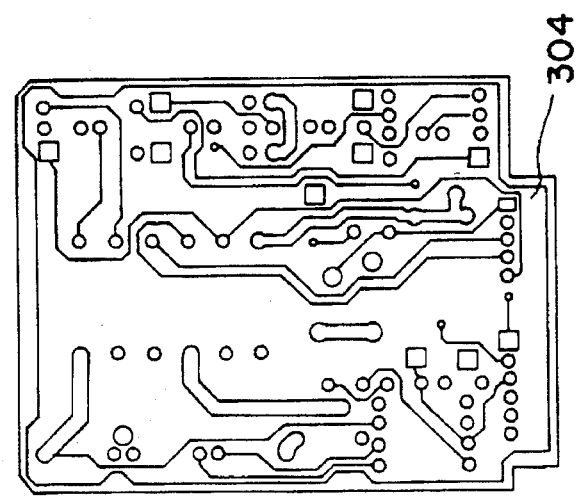
Figure 30A:
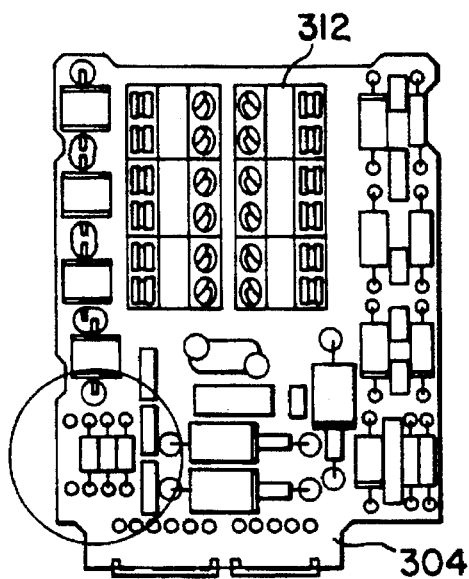
FIGS. 30A–30B are top and side views, respectively, of a field-side circuit as shown in FIGS. 27A–27B.
Figure 30B:
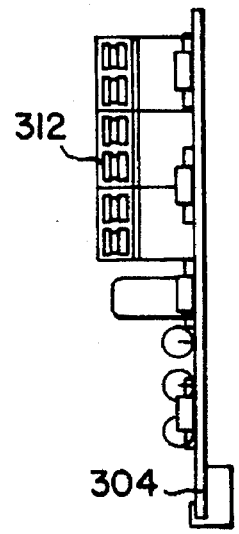
Figure 30C:
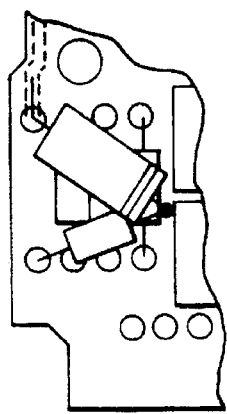
FIG. 30C is a detail showing the placement of parts on the printed circuit board of FIGS. 30A–30B.
Figure 30D:
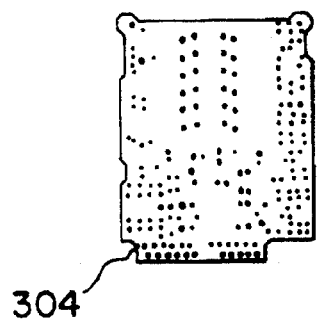
Figure 31A:
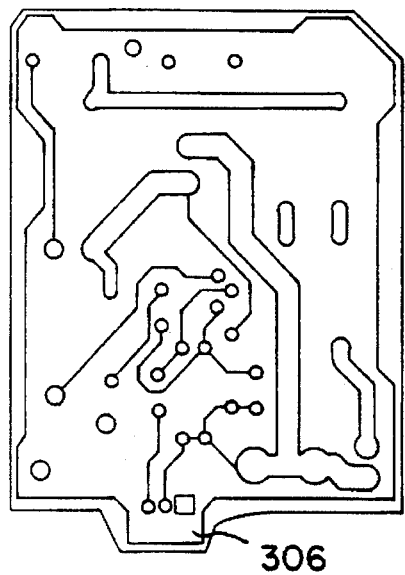
FIGS. 31A–D show a solder-side view, component-side view, drill pattern, and parts placement diagram, respectively, for a printed circuit board for the HART-side circuit shown in FIG. 26.
Figure 31B:
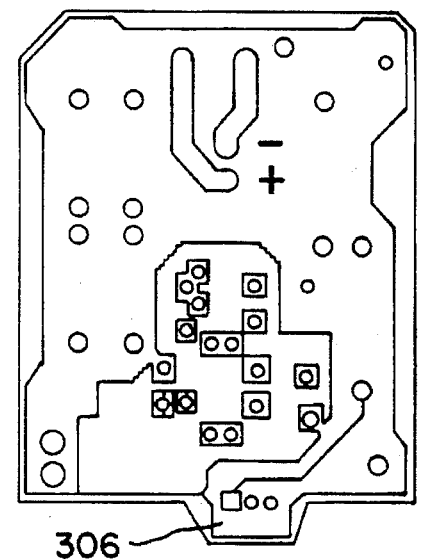
Figure 31C:
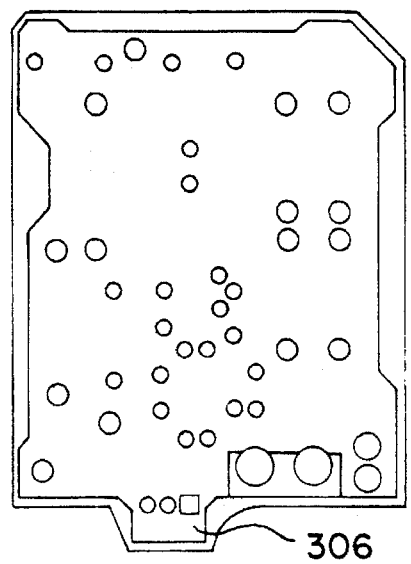
Figure 31D:
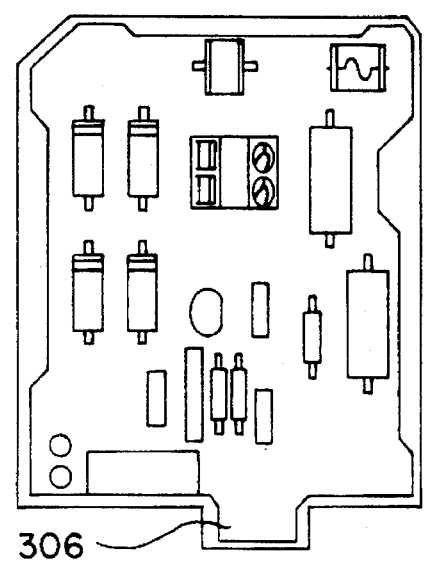

FIGS. 29A-29C show a solder-side view, component side view, and drill pattern, respectively, for a printed circuit board for implementing the field-side circuit shown in FIGS. 27A-27B, and FIG. 30C shows preferred placement dimensions for the circuit components out his printed circuit board. These figures clearly show connector 304 which projects from the terminal block housing 232 in FIGS. 24B and 24C.

FIGS. 30A and 30B show a physical layout of components in the field-side circuit of FIGS. 27A and 27B on the printed circuit board of FIGS. 29A-29C. These figures clearly show connector 304 as well as field terminal connection block 312.

Figure 32A:
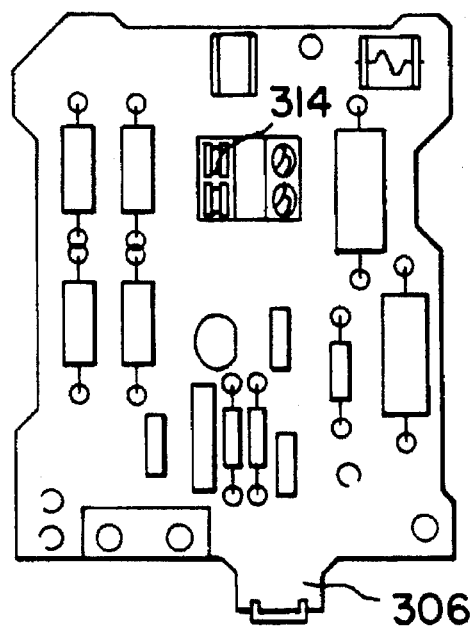
FIGS. 32A–32C are top, side and bottom views, respectively, of a HART-side circuit as shown in FIGS. 27A–27B.
Figure 32B:
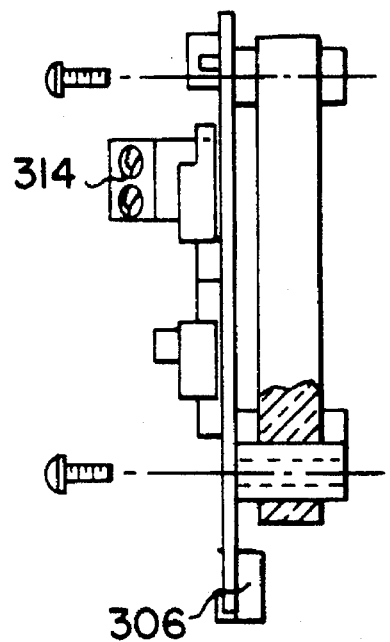
Figure 32C:
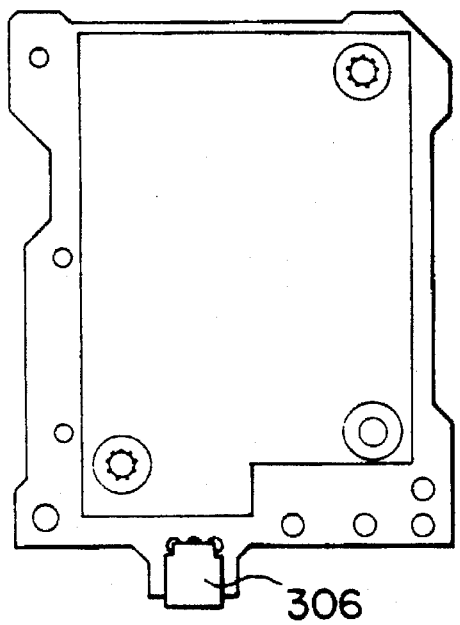
Figure 32D:
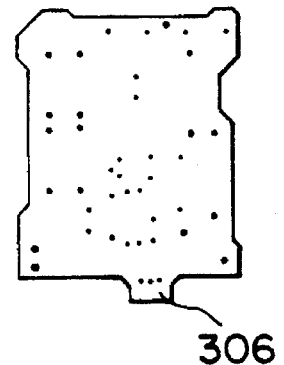
FIG. 32D is a component-side spacing diagram for the printed circuit board of FIGS. 32A–32C.

FIGS. 31A-31D show a solder-side view, component side view, drill pattern, and parts placement diagram, respectively, for a printed circuit board for implementing the field-side circuit shown in FIG. 26, and FIG. 32D shows preferred placement dimensions for the circuit components on this printed circuit board. These figures clearly show connector 306 which projects from the terminal block housing 232 in FIGS. 24B and 24C.

FIGS. 32A-32C show a physical layout of components in the field-side circuit of FIGS. 27A and 27B on the printed FIGS. 32A-32C show a physical layout of components in the field-side circuit of FIGS. 27A and 27B on the printed circuit board of FIGS. 29A-29C. These figures clearly show connector 306 as well as field terminal connection block 314.

Although a few preferred embodiments of the invention have been shown and described, it will be appreciated by those skilled in the art that changes may be made in these embodiments without departing from the principles and the spirit of the invention, the scope of which is defined in the appended claims.

What is claimed is:

1. A reversible float assembly, comprising:

a float disposed on a liquid and having a body with a first surface portion and a second surface portion on generally opposite sides of said body;

an elongated flexible member having an upper end held above the liquid and the lower end adapted to be connected to said float;

a first attachment disposed on said first surface portion of said body and constructed and arranged to be attached with said elongated flexible member;

a second attachment disposed on said second surface portion of said body and constructed and arranged to be attached with said elongated flexible member;

said lower end of said elongated flexible member being disposed above said liquid and connected to one of said first and second attachments;

at least one guide eye constructed and arranged to receive an elongate guide member in such fashion as to restrict movement of said body to generally vertical movement, said at least one guide eye being disposed on said body at a position between said first attachment and said second attachment such that when said body floats on said liquid in a first orientation with said second surface portion and said second attachment submerged in the liquid said guide eye is also submerged in the liquid, and when said body floats on the liquid in a second orientation with said first surface portion and said first attachment submerged in the liquid said guide eye is above the liquid.

* * * * *